US008575742B1

(12) United States Patent
Kim et al.

(10) Patent No.: US 8,575,742 B1
(45) Date of Patent: Nov. 5, 2013

(54) SEMICONDUCTOR DEVICE WITH INCREASED I/O LEADFRAME INCLUDING POWER BARS

(75) Inventors: Wan Jong Kim, Goyang-si (KR); Young Tak Do, Bupyeong-gu (KR); Byong Woo Cho, Seongbuk-gu (KR)

(73) Assignee: Amkor Technology, Inc., Chandler, AZ (US)

( * ) Notice: Subject to any disclaimer, the term of this patent is extended or adjusted under 35 U.S.C. 154(b) by 451 days.

(21) Appl. No.: 12/419,180

(22) Filed: Apr. 6, 2009

(51) Int. Cl.
*H01L 23/52* (2006.01)

(52) U.S. Cl.
USPC ............ 257/691; 257/688; 257/690; 257/696; 257/730; 257/670

(58) Field of Classification Search
USPC .......... 257/688, 690, 691, 696, 730, 670, 666
See application file for complete search history.

(56) References Cited

U.S. PATENT DOCUMENTS

| | | | |
|---|---|---|---|
| 2,596,993 | A | 5/1952 | Gookin |
| 3,435,815 | A | 4/1969 | Forcier |
| 3,734,660 | A | 5/1973 | Davies et al. |
| 3,838,984 | A | 10/1974 | Crane et al. |
| 4,054,238 | A | 10/1977 | Lloyd et al. |
| 4,189,342 | A | 2/1980 | Kock |
| 4,221,925 | A | 9/1980 | Finley et al. |
| 4,258,381 | A | 3/1981 | Inaba |
| 4,289,922 | A | 9/1981 | Devlin |

(Continued)

FOREIGN PATENT DOCUMENTS

| | | |
|---|---|---|
| DE | 19734794 A1 | 8/1997 |
| EP | 0393997 | 10/1990 |

(Continued)

OTHER PUBLICATIONS

National Semiconductor Corporation, "Leadless Leadframe Package," Informational Pamphlet from webpage, 21 pages, Oct. 2002, www.national.com.

(Continued)

*Primary Examiner* — Kimberly Rizkallah
*Assistant Examiner* — Caleb Henry

(57) ABSTRACT

A semiconductor device or semiconductor package (e.g., a QFP package) including a uniquely configured leadframe sized and configured to maximize the available number of exposed leads in the semiconductor package, and further to provide one or more power bars in the semiconductor package. More particularly, the semiconductor package of the present invention includes a generally planar die paddle or die pad defining multiple peripheral edge segments. In addition, the semiconductor package includes a plurality of leads. Some of these leads include exposed bottom surface portions which are provided in at least two concentric rows or rings which at least partially circumvent the die pad, with other leads including portions which protrude from respective side surfaces of a package body of the semiconductor package. Connected to the top surface of the die pad is at least one semiconductor die which is electrically connected to at least some of the leads. At least portions of the die pad, the power bars, leads, and the semiconductor die are encapsulated by the package body, with at least portions of the bottom surfaces of the die pad and some of the leads being exposed in a common exterior surface of the package body. The bottom surface(s) of the power bar(s) may also be exposed in such common exterior surface of the package body, or the power bar(s) may be completely covered by the package body.

19 Claims, 17 Drawing Sheets

(56) References Cited

U.S. PATENT DOCUMENTS

| | | |
|---|---|---|
| 4,301,464 A | 11/1981 | Otsuki et al. |
| 4,332,537 A | 6/1982 | Slepcevic |
| 4,417,266 A | 11/1983 | Grabbe |
| 4,451,224 A | 5/1984 | Harding |
| 4,530,152 A | 7/1985 | Roche et al. |
| 4,541,003 A | 9/1985 | Otsuka et al. |
| 4,646,710 A | 3/1987 | Schmid et al. |
| 4,707,724 A | 11/1987 | Suzuki et al. |
| 4,727,633 A | 3/1988 | Herrick |
| 4,737,839 A | 4/1988 | Burt |
| 4,756,080 A | 7/1988 | Thorpe, Jr. et al. |
| 4,812,896 A | 3/1989 | Rothgery et al. |
| 4,862,245 A | 8/1989 | Pashby et al. |
| 4,862,246 A | 8/1989 | Masuda et al. |
| 4,907,067 A | 3/1990 | Derryberry |
| 4,920,074 A | 4/1990 | Shimizu et al. |
| 4,935,803 A | 6/1990 | Kalfus et al. |
| 4,942,454 A | 7/1990 | Mori et al. |
| 4,987,475 A | 1/1991 | Sclesinger et al. |
| 5,018,003 A | 5/1991 | Yasunaga |
| 5,029,386 A | 7/1991 | Chao et al. |
| 5,041,902 A | 8/1991 | McShane |
| 5,057,900 A | 10/1991 | Yamazaki |
| 5,059,379 A | 10/1991 | Tsutsumi et al. |
| 5,065,223 A | 11/1991 | Matsuki et al. |
| 5,070,039 A | 12/1991 | Johnson et al. |
| 5,087,961 A | 2/1992 | Long et al. |
| 5,091,341 A | 2/1992 | Asada et al. |
| 5,096,852 A | 3/1992 | Hobson et al. |
| 5,118,298 A | 6/1992 | Murphy |
| 5,122,860 A | 6/1992 | Kikuchi et al. |
| 5,134,773 A | 8/1992 | LeMaire et al. |
| 5,151,039 A | 9/1992 | Murphy |
| 5,157,475 A | 10/1992 | Yamaguchi |
| 5,157,480 A | 10/1992 | McShane et al. |
| 5,168,368 A | 12/1992 | Gow, 3rd et al. |
| 5,172,213 A | 12/1992 | Zimmerman |
| 5,172,214 A | 12/1992 | Casto |
| 5,175,060 A | 12/1992 | Enomoto et al. |
| 5,200,362 A | 4/1993 | Lin et al. |
| 5,200,809 A | 4/1993 | Kwon |
| 5,214,845 A | 6/1993 | King et al. |
| 5,216,278 A | 6/1993 | Lin et al. |
| 5,218,231 A | 6/1993 | Kudo |
| 5,221,642 A | 6/1993 | Burns |
| 5,250,841 A | 10/1993 | Sloan et al. |
| 5,252,853 A | 10/1993 | Michii |
| 5,258,094 A | 11/1993 | Furui et al. |
| 5,266,834 A | 11/1993 | Nishi et al. |
| 5,273,938 A | 12/1993 | Lin et al. |
| 5,277,972 A | 1/1994 | Sakumoto et al. |
| 5,278,446 A | 1/1994 | Nagaraj et al. |
| 5,279,029 A | 1/1994 | Burns |
| 5,281,849 A | 1/1994 | Singh Deo et al. |
| 5,285,352 A | 2/1994 | Pastore et al. |
| 5,294,897 A | 3/1994 | Notani et al. |
| 5,327,008 A | 7/1994 | Djennas et al. |
| 5,332,864 A | 7/1994 | Liang et al. |
| 5,335,771 A | 8/1994 | Murphy |
| 5,336,931 A | 8/1994 | Juskey et al. |
| 5,343,076 A | 8/1994 | Katayama et al. |
| 5,358,905 A | 10/1994 | Chiu |
| 5,365,106 A | 11/1994 | Watanabe |
| 5,381,042 A | 1/1995 | Lerner et al. |
| 5,391,439 A | 2/1995 | Tomita et al. |
| 5,406,124 A | 4/1995 | Morita et al. |
| 5,410,180 A | 4/1995 | Fujii et al. |
| 5,414,299 A | 5/1995 | Wang et al. |
| 5,417,905 A | 5/1995 | LeMaire et al. |
| 5,424,576 A | 6/1995 | Djennas et al. |
| 5,428,248 A | 6/1995 | Cha |
| 5,435,057 A | 7/1995 | Bindra et al. |
| 5,444,301 A | 8/1995 | Song et al. |
| 5,452,511 A | 9/1995 | Chang |
| 5,454,905 A | 10/1995 | Fogelson |
| 5,467,032 A | 11/1995 | Lee |
| 5,474,958 A | 12/1995 | Djennas et al. |
| 5,484,274 A | 1/1996 | Neu |
| 5,493,151 A | 2/1996 | Asada et al. |
| 5,508,556 A | 4/1996 | Lin |
| 5,517,056 A | 5/1996 | Bigler et al. |
| 5,521,429 A | 5/1996 | Aono et al. |
| 5,528,076 A | 6/1996 | Pavio |
| 5,534,467 A | 7/1996 | Rostoker |
| 5,539,251 A | 7/1996 | Iverson et al. |
| 5,543,657 A | 8/1996 | Diffenderfer et al. |
| 5,544,412 A | 8/1996 | Romero et al. |
| 5,545,923 A | 8/1996 | Barber |
| 5,581,122 A | 12/1996 | Chao et al. |
| 5,592,019 A | 1/1997 | Ueda et al. |
| 5,592,025 A | 1/1997 | Clark et al. |
| 5,594,274 A | 1/1997 | Suetaki |
| 5,595,934 A | 1/1997 | Kim |
| 5,604,376 A | 2/1997 | Hamburgen et al. |
| 5,608,265 A | 3/1997 | Kitano et al. |
| 5,608,267 A | 3/1997 | Mahulikar et al. |
| 5,625,222 A | 4/1997 | Yoneda et al. |
| 5,633,528 A | 5/1997 | Abbott et al. |
| 5,637,922 A | 6/1997 | Fillion et al. |
| 5,639,990 A | 6/1997 | Nishihara et al. |
| 5,640,047 A | 6/1997 | Nakashima |
| 5,641,997 A | 6/1997 | Ohta et al. |
| 5,643,433 A | 7/1997 | Fukase et al. |
| 5,644,169 A | 7/1997 | Chun |
| 5,646,831 A | 7/1997 | Manteghi |
| 5,650,663 A | 7/1997 | Parthasaranthi |
| 5,661,088 A | 8/1997 | Tessier et al. |
| 5,665,996 A | 9/1997 | Williams et al. |
| 5,673,479 A | 10/1997 | Hawthorne |
| 5,683,806 A | 11/1997 | Sakumoto et al. |
| 5,683,943 A | 11/1997 | Yamada |
| 5,689,135 A | 11/1997 | Ball |
| 5,696,666 A | 12/1997 | Miles et al. |
| 5,701,034 A | 12/1997 | Marrs |
| 5,703,407 A | 12/1997 | Hori |
| 5,710,064 A | 1/1998 | Song et al. |
| 5,723,899 A | 3/1998 | Shin |
| 5,724,233 A | 3/1998 | Honda et al. |
| 5,726,493 A | 3/1998 | Yamashita |
| 5,736,432 A | 4/1998 | Mackessy |
| 5,745,984 A | 5/1998 | Cole, Jr. et al. |
| 5,753,532 A | 5/1998 | Sim |
| 5,753,977 A | 5/1998 | Kusaka et al. |
| 5,766,972 A | 6/1998 | Takahashi et al. |
| 5,767,566 A | 6/1998 | Suda |
| 5,770,888 A | 6/1998 | Song et al. |
| 5,776,798 A | 7/1998 | Quan et al. |
| 5,783,861 A | 7/1998 | Son |
| 5,801,440 A | 9/1998 | Chu et al. |
| 5,814,877 A | 9/1998 | Diffenderfer et al. |
| 5,814,881 A | 9/1998 | Alagaratnam et al. |
| 5,814,883 A | 9/1998 | Sawai et al. |
| 5,814,884 A | 9/1998 | Davies et al. |
| 5,817,540 A | 10/1998 | Wark |
| 5,818,105 A | 10/1998 | Kouda |
| 5,821,457 A | 10/1998 | Mosley et al. |
| 5,821,615 A | 10/1998 | Lee |
| 5,834,830 A | 11/1998 | Cho |
| 5,835,988 A | 11/1998 | Ishii |
| 5,844,306 A | 12/1998 | Fujita et al. |
| 5,854,511 A | 12/1998 | Shin et al. |
| 5,854,512 A | 12/1998 | Manteghi |
| 5,856,911 A | 1/1999 | Riley |
| 5,859,471 A | 1/1999 | Kuraishi et al. |
| 5,866,939 A | 2/1999 | Shin et al. |
| 5,866,942 A | 2/1999 | Suzuki et al. |
| 5,871,782 A | 2/1999 | Choi |
| 5,874,784 A | 2/1999 | Aoki et al. |
| 5,877,043 A | 3/1999 | Alcoe et al. |
| 5,886,397 A | 3/1999 | Ewer |
| 5,973,935 A | 10/1999 | Schoenfeld et al. |
| 5,977,630 A | 11/1999 | Woodworth et al. |
| RE36,773 E | 7/2000 | Nomi et al. |
| 6,107,679 A | 8/2000 | Noguchi |

(56) References Cited

U.S. PATENT DOCUMENTS

| | | | |
|---|---|---|---|
| 6,143,981 A | 11/2000 | Glenn | |
| 6,150,709 A | 11/2000 | Shin et al. | |
| 6,157,074 A | 12/2000 | Lee | |
| 6,166,430 A | 12/2000 | Yamaguchi | |
| 6,169,329 B1 | 1/2001 | Farnworth et al. | |
| 6,177,718 B1 | 1/2001 | Kozono | |
| 6,181,002 B1 | 1/2001 | Juso et al. | |
| 6,184,465 B1 | 2/2001 | Corisis | |
| 6,184,573 B1 | 2/2001 | Pu | |
| 6,194,777 B1 | 2/2001 | Abbott et al. | |
| 6,197,615 B1 | 3/2001 | Song et al. | |
| 6,198,171 B1 | 3/2001 | Huang et al. | |
| 6,201,186 B1 | 3/2001 | Daniels et al. | |
| 6,201,292 B1 | 3/2001 | Yagi et al. | |
| 6,204,554 B1 | 3/2001 | Ewer et al. | |
| 6,208,020 B1 | 3/2001 | Minamio et al. | |
| 6,208,021 B1 | 3/2001 | Ohuchi et al. | |
| 6,208,023 B1 | 3/2001 | Nakayama et al. | |
| 6,211,462 B1 | 4/2001 | Carter, Jr. et al. | |
| 6,218,731 B1 | 4/2001 | Huang et al. | |
| 6,222,258 B1 | 4/2001 | Asano et al. | |
| 6,222,259 B1 | 4/2001 | Park et al. | |
| 6,225,146 B1 * | 5/2001 | Yamaguchi et al. | 438/123 |
| 6,229,200 B1 | 5/2001 | McClellan et al. | |
| 6,229,205 B1 | 5/2001 | Jeong et al. | |
| 6,238,952 B1 | 5/2001 | Lin et al. | |
| 6,239,367 B1 | 5/2001 | Hsuan et al. | |
| 6,239,384 B1 | 5/2001 | Smith et al. | |
| 6,242,281 B1 | 6/2001 | McClellan et al. | |
| 6,256,200 B1 | 7/2001 | Lam et al. | |
| 6,258,629 B1 | 7/2001 | Niones et al. | |
| 6,261,864 B1 | 7/2001 | Jung et al. | |
| 6,281,566 B1 | 8/2001 | Magni | |
| 6,281,568 B1 | 8/2001 | Glenn et al. | |
| 6,282,094 B1 | 8/2001 | Lo et al. | |
| 6,282,095 B1 | 8/2001 | Houghton et al. | |
| 6,285,075 B1 | 9/2001 | Combs et al. | |
| 6,291,271 B1 | 9/2001 | Lee et al. | |
| 6,291,273 B1 | 9/2001 | Miyaki et al. | |
| 6,294,100 B1 | 9/2001 | Fan et al. | |
| 6,294,830 B1 | 9/2001 | Fjelstad | |
| 6,295,977 B1 | 10/2001 | Ripper et al. | |
| 6,297,548 B1 | 10/2001 | Moden et al. | |
| 6,303,984 B1 | 10/2001 | Corisis | |
| 6,303,997 B1 | 10/2001 | Lee | |
| 6,306,685 B1 | 10/2001 | Liu et al. | |
| 6,307,272 B1 | 10/2001 | Takahashi et al. | |
| 6,309,909 B1 | 10/2001 | Ohgiyama | |
| 6,316,822 B1 | 11/2001 | Venkateshwaran et al. | |
| 6,316,838 B1 | 11/2001 | Ozawa et al. | |
| 6,323,550 B1 | 11/2001 | Martin et al. | |
| 6,326,243 B1 | 12/2001 | Suzuya et al. | |
| 6,326,244 B1 | 12/2001 | Brooks et al. | |
| 6,326,678 B1 | 12/2001 | Karnezos et al. | |
| 6,335,564 B1 | 1/2002 | Pour | |
| 6,337,510 B1 | 1/2002 | Chun-Jen et al. | |
| 6,339,252 B1 | 1/2002 | Niones et al. | |
| 6,339,255 B1 | 1/2002 | Shin | |
| 6,342,730 B1 | 1/2002 | Jung et al. | |
| 6,348,726 B1 | 2/2002 | Bayan et al. | |
| 6,355,502 B1 | 3/2002 | Kang et al. | |
| 6,359,221 B1 | 3/2002 | Yamada et al. | |
| 6,362,525 B1 | 3/2002 | Rahim | |
| 6,369,447 B2 | 4/2002 | Mori | |
| 6,369,454 B1 | 4/2002 | Chung | |
| 6,373,127 B1 | 4/2002 | Baudouin et al. | |
| 6,377,464 B1 | 4/2002 | Hashemi et al. | |
| 6,380,048 B1 | 4/2002 | Boon et al. | |
| 6,384,472 B1 | 5/2002 | Huang | |
| 6,388,336 B1 | 5/2002 | Venkateshwaran et al. | |
| 6,395,578 B1 | 5/2002 | Shin et al. | |
| 6,399,415 B1 | 6/2002 | Bayan et al. | |
| 6,400,004 B1 | 6/2002 | Fan et al. | |
| 6,410,979 B2 | 6/2002 | Abe | |
| 6,414,385 B1 | 7/2002 | Huang et al. | |
| 6,420,779 B1 | 7/2002 | Sharma et al. | |
| 6,421,013 B1 | 7/2002 | Chung | |
| 6,423,643 B1 | 7/2002 | Furuhata et al. | |
| 6,429,508 B1 | 8/2002 | Gang | |
| 6,437,429 B1 | 8/2002 | Su et al. | |
| 6,444,499 B1 | 9/2002 | Swiss et al. | |
| 6,448,633 B1 | 9/2002 | Yee et al. | |
| 6,452,279 B2 | 9/2002 | Shimoda | |
| 6,459,148 B1 | 10/2002 | Chun-Jen et al. | |
| 6,464,121 B2 | 10/2002 | Reijnders | |
| 6,465,883 B2 | 10/2002 | Olofsson | |
| 6,472,735 B2 | 10/2002 | Isaak | |
| 6,475,646 B2 | 11/2002 | Park et al. | |
| 6,476,469 B2 | 11/2002 | Huang et al. | |
| 6,476,474 B1 | 11/2002 | Hung | |
| 6,482,680 B1 | 11/2002 | Khor et al. | |
| 6,483,178 B1 | 11/2002 | Chuang | |
| 6,492,718 B2 | 12/2002 | Ohmori et al. | |
| 6,495,909 B2 | 12/2002 | Jung et al. | |
| 6,498,099 B1 | 12/2002 | McLellan et al. | |
| 6,498,392 B2 | 12/2002 | Azuma | |
| 6,507,096 B2 | 1/2003 | Gang | |
| 6,507,120 B2 | 1/2003 | Lo et al. | |
| 6,518,089 B2 | 2/2003 | Coyle | |
| 6,525,942 B2 | 2/2003 | Huang et al. | |
| 6,528,893 B2 | 3/2003 | Jung et al. | |
| 6,534,849 B1 | 3/2003 | Gang | |
| 6,545,332 B2 | 4/2003 | Huang | |
| 6,545,345 B1 | 4/2003 | Glenn et al. | |
| 6,552,421 B2 | 4/2003 | Kishimoto et al. | |
| 6,559,525 B2 | 5/2003 | Huang | |
| 6,566,168 B2 | 5/2003 | Gang | |
| 6,580,161 B2 | 6/2003 | Kobayakawa | |
| 6,583,503 B2 | 6/2003 | Akram et al. | |
| 6,585,905 B1 | 7/2003 | Fan et al. | |
| 6,603,196 B2 | 8/2003 | Lee et al. | |
| 6,624,005 B1 | 9/2003 | DiCaprio et al. | |
| 6,627,977 B1 | 9/2003 | Foster | |
| 6,630,373 B2 * | 10/2003 | Punzalan et al. | 438/123 |
| 6,646,339 B1 | 11/2003 | Ku | |
| 6,667,546 B2 | 12/2003 | Huang et al. | |
| 6,677,663 B1 | 1/2004 | Ku et al. | |
| 6,686,649 B1 | 2/2004 | Mathews et al. | |
| 6,696,752 B2 | 2/2004 | Su et al. | |
| 6,700,189 B2 | 3/2004 | Shibata | |
| 6,713,375 B2 | 3/2004 | Shenoy | |
| 6,757,178 B2 | 6/2004 | Okabe et al. | |
| 6,800,936 B2 | 10/2004 | Kosemura et al. | |
| 6,812,552 B2 | 11/2004 | Islam et al. | |
| 6,818,973 B1 | 11/2004 | Foster | |
| 6,858,919 B2 | 2/2005 | Seo et al. | |
| 6,867,492 B2 | 3/2005 | Auburger et al. | |
| 6,876,068 B1 | 4/2005 | Lee et al. | |
| 6,878,571 B2 | 4/2005 | Isaak et al. | |
| 6,897,552 B2 | 5/2005 | Nakao | |
| 6,927,478 B2 | 8/2005 | Paek | |
| 6,967,125 B2 | 11/2005 | Fee et al. | |
| 6,977,431 B1 * | 12/2005 | Oh et al. | 257/696 |
| 6,995,459 B2 * | 2/2006 | Lee et al. | 257/676 |
| 7,002,805 B2 | 2/2006 | Lee et al. | |
| 7,005,327 B2 | 2/2006 | Kung et al. | |
| 7,015,571 B2 | 3/2006 | Chang et al. | |
| 7,045,396 B2 * | 5/2006 | Crowley et al. | 438/123 |
| 7,053,469 B2 | 5/2006 | Koh et al. | |
| 7,060,535 B1 * | 6/2006 | Sirinorakul et al. | 438/123 |
| 7,075,816 B2 | 7/2006 | Fee et al. | |
| 7,102,209 B1 | 9/2006 | Bayan et al. | |
| 7,109,572 B2 | 9/2006 | Fee et al. | |
| 7,185,426 B1 | 3/2007 | Hiner et al. | |
| 7,193,298 B2 | 3/2007 | Hong et al. | |
| 7,211,471 B1 * | 5/2007 | Foster | 438/123 |
| 7,242,081 B1 | 7/2007 | Lee | |
| 7,245,007 B1 | 7/2007 | Foster | |
| 7,253,503 B1 | 8/2007 | Fusaro et al. | |
| 7,709,937 B2 * | 5/2010 | Danno | 257/672 |
| 7,737,537 B2 * | 6/2010 | Bemmerl et al. | 257/670 |
| 7,786,557 B2 * | 8/2010 | Hsieh et al. | 257/676 |
| 8,058,720 B2 * | 11/2011 | Chen et al. | 257/691 |
| 8,097,942 B2 * | 1/2012 | Misumi et al. | 257/691 |

(56) References Cited

U.S. PATENT DOCUMENTS

| | | | |
|---|---|---|---|
| 8,188,579 B1* | 5/2012 | Kim et al. ............. 257/666 |
| 2001/0008305 A1 | 7/2001 | McClellan et al. |
| 2001/0014538 A1 | 8/2001 | Kwan et al. |
| 2002/0011654 A1 | 1/2002 | Kimura |
| 2002/0024122 A1* | 2/2002 | Jung et al. ............. 257/666 |
| 2002/0027297 A1 | 3/2002 | Ikenaga et al. |
| 2002/0038873 A1 | 4/2002 | Hiyoshi |
| 2002/0072147 A1 | 6/2002 | Sayanagi et al. |
| 2002/0111009 A1 | 8/2002 | Huang et al. |
| 2002/0140061 A1 | 10/2002 | Lee |
| 2002/0140068 A1 | 10/2002 | Lee et al. |
| 2002/0140081 A1 | 10/2002 | Chou et al. |
| 2002/0158318 A1 | 10/2002 | Chen |
| 2002/0163015 A1 | 11/2002 | Lee et al. |
| 2002/0167060 A1 | 11/2002 | Buijsman et al. |
| 2003/0006055 A1 | 1/2003 | Chien-Hung et al. |
| 2003/0030131 A1 | 2/2003 | Lee et al. |
| 2003/0059644 A1 | 3/2003 | Datta et al. |
| 2003/0064548 A1 | 4/2003 | Isaak |
| 2003/0073265 A1 | 4/2003 | Hu et al. |
| 2003/0102537 A1 | 6/2003 | McLellan et al. |
| 2003/0164554 A1 | 9/2003 | Fee et al. |
| 2003/0168719 A1* | 9/2003 | Cheng et al. ............. 257/666 |
| 2003/0198032 A1 | 10/2003 | Collander et al. |
| 2004/0014257 A1* | 1/2004 | Kim et al. ............. 438/111 |
| 2004/0027788 A1 | 2/2004 | Chiu et al. |
| 2004/0056277 A1 | 3/2004 | Karnezos |
| 2004/0061212 A1 | 4/2004 | Karnezos |
| 2004/0061213 A1 | 4/2004 | Karnezos |
| 2004/0063242 A1 | 4/2004 | Karnezos |
| 2004/0063246 A1 | 4/2004 | Karnezos |
| 2004/0065963 A1 | 4/2004 | Karnezos |
| 2004/0080025 A1 | 4/2004 | Kasahara et al. |
| 2004/0089926 A1 | 5/2004 | Hsu et al. |
| 2004/0097016 A1* | 5/2004 | Yee et al. ............. 438/124 |
| 2004/0164387 A1 | 8/2004 | Ikenaga et al. |
| 2004/0238921 A1* | 12/2004 | Lee et al. ............. 257/666 |
| 2004/0253803 A1 | 12/2004 | Tomono et al. |
| 2005/0056914 A1* | 3/2005 | Hong et al. ............. 257/666 |
| 2005/0139969 A1* | 6/2005 | Lee et al. ............. 257/672 |
| 2005/0199987 A1* | 9/2005 | Danno et al. ............. 257/672 |
| 2006/0087020 A1 | 4/2006 | Hirano et al. |
| 2006/0157843 A1 | 7/2006 | Hwang |
| 2006/0216868 A1 | 9/2006 | Yang et al. |
| 2006/0231939 A1 | 10/2006 | Kawabata et al. |
| 2007/0023202 A1 | 2/2007 | Shibata |
| 2008/0036051 A1* | 2/2008 | Espiritu et al. ............. 257/666 |
| 2008/0230887 A1 | 9/2008 | Sun et al. |
| 2010/0044850 A1* | 2/2010 | Lin et al. ............. 257/690 |

FOREIGN PATENT DOCUMENTS

| | | |
|---|---|---|
| EP | 0459493 | 12/1991 |
| EP | 0720225 | 3/1996 |
| EP | 0720234 | 3/1996 |
| EP | 0794572 A2 | 10/1997 |
| EP | 0844665 | 5/1998 |
| EP | 0936671 | 8/1999 |
| EP | 0989608 | 3/2000 |
| EP | 1032037 | 8/2000 |
| JP | 55163868 | 12/1980 |
| JP | 5745959 | 3/1982 |
| JP | 58160096 | 8/1983 |
| JP | 59208756 | 11/1984 |
| JP | 59227143 | 12/1984 |
| JP | 60010756 | 1/1985 |
| JP | 60116239 | 8/1985 |
| JP | 60195957 | 10/1985 |
| JP | 60231349 | 11/1985 |
| JP | 6139555 | 2/1986 |
| JP | 61248541 | 11/1986 |
| JP | 629639 | 1/1987 |
| JP | 6333854 | 2/1988 |
| JP | 63067762 | 3/1988 |
| JP | 63188964 | 8/1988 |
| JP | 63205935 | 8/1988 |
| JP | 63233555 | 9/1988 |
| JP | 63249345 | 10/1988 |
| JP | 63289951 | 11/1988 |
| JP | 63316470 | 12/1988 |
| JP | 64054749 | 3/1989 |
| JP | 1106456 | 4/1989 |
| JP | 1175250 | 7/1989 |
| JP | 1205544 | 8/1989 |
| JP | 1251747 | 10/1989 |
| JP | 2129948 | 5/1990 |
| JP | 369248 | 7/1991 |
| JP | 3177060 | 8/1991 |
| JP | 3289162 | 12/1991 |
| JP | 4098864 | 3/1992 |
| JP | 5129473 | 5/1993 |
| JP | 5166992 | 7/1993 |
| JP | 5283460 | 10/1993 |
| JP | 6061401 | 3/1994 |
| JP | 692076 | 4/1994 |
| JP | 6140563 | 5/1994 |
| JP | 652333 | 9/1994 |
| JP | 6252333 | 9/1994 |
| JP | 6260532 | 9/1994 |
| JP | 7297344 | 11/1995 |
| JP | 7312405 | 11/1995 |
| JP | 8064364 | 3/1996 |
| JP | 8083877 | 3/1996 |
| JP | 8125066 | 5/1996 |
| JP | 964284 | 6/1996 |
| JP | 8222682 | 8/1996 |
| JP | 8306853 | 11/1996 |
| JP | 98205 | 1/1997 |
| JP | 98206 | 1/1997 |
| JP | 98207 | 1/1997 |
| JP | 992775 | 4/1997 |
| JP | 9260568 | 10/1997 |
| JP | 9293822 | 11/1997 |
| JP | 10022447 | 1/1998 |
| JP | 10199934 | 7/1998 |
| JP | 10256240 | 9/1998 |
| JP | 11307675 | 11/1998 |
| JP | 2000150765 | 5/2000 |
| JP | 20010600648 | 3/2001 |
| JP | 2002519848 | 7/2002 |
| JP | 200203497 | 8/2002 |
| JP | 2003243595 | 8/2003 |
| JP | 2004158753 | 6/2004 |
| KR | 941979 | 1/1994 |
| KR | 19940010938 | 5/1994 |
| KR | 19950018924 | 6/1995 |
| KR | 19950041844 | 11/1995 |
| KR | 19950044554 | 11/1995 |
| KR | 19950052621 | 12/1995 |
| KR | 1996074111 | 12/1996 |
| KR | 9772358 | 11/1997 |
| KR | 100220154 | 6/1999 |
| KR | 20000072714 | 12/2000 |
| KR | 20000086238 | 12/2000 |
| KR | 20020049944 | 6/2002 |
| WO | 9956316 | 11/1999 |
| WO | 9967821 | 12/1999 |

OTHER PUBLICATIONS

Vishay, "4 Milliohms in the So-8: Vishay Siliconix Sets New Record for Power MOSFET On-Resistance," Press Release from webpage, 3 pages, www.vishay.com/news/releases, Nov. 7, 2002.

Patrick Mannion, "MOSFETs Break out of the Shackles of Wire Bonding," Informational Packet, 5 pages, Electronic Design, Mar. 22, 1999 vol. 47, No. 6, www.elecdesign.com/1999/mar2299/ti/0322ti1.shtml.

* cited by examiner

SEMICONDUCTOR DEVICE WITH INCREASED I/O LEADFRAME INCLUDING POWER BARS

CROSS-REFERENCE TO RELATED APPLICATIONS

Not Applicable

STATEMENT RE: FEDERALLY SPONSORED RESEARCH/DEVELOPMENT

Not Applicable

BACKGROUND OF THE INVENTION

1. Field of the Invention

The present invention relates generally to integrated circuit package technology and, more particularly, to an increased capacity QFP semiconductor package which includes one or more internal power bars, exposed leads and an exposed die pad on the bottom surface of the package body thereof, and additional leads which protrude from side surfaces of the package body.

2. Description of the Related Art

Semiconductor dies are conventionally enclosed in plastic packages that provide protection from hostile environments and enable electrical interconnection between the semiconductor die and an underlying substrate such as a printed circuit board (PCB) or motherboard. The elements of such a package include a metal leadframe, an integrated circuit or semiconductor die, bonding material to attach the semiconductor die to the leadframe, bond wires which electrically connect pads on the semiconductor die to individual leads of the leadframe, and a hard plastic encapsulant material which covers the other components and forms the exterior of the semiconductor package commonly referred to as the package body.

The leadframe is the central supporting structure of such a package, and is typically fabricated by chemically etching or mechanically stamping a metal strip. A portion of the leadframe is internal to the package, i.e., completely surrounded by the plastic encapsulant or package body. Portions of the leads of the leadframe extend externally from the package body or are partially exposed therein for use in electrically connecting the package to another component. In certain semiconductor packages, a portion of the die pad of the leadframe also remains exposed within the package body.

Leadframes for semiconductor packages can be largely classified into copper-based leadframes (copper/iron/phosphorous; 99.8/0.01/0.025), copper alloy-based leadframes (copper/chromium/tin/zinc; 99.0/0.25/0.22), alloy 42-based leadframes (iron/nickel; 58.0/42.0), etc. according to the composition of the elements or materials included in the leadframe. Exemplary semiconductor packages or devices employing leadframes include a through-hole mounting dual type inline package (DIP), a surface mounting type quad flat package (QFP), and a small outline package (SOP).

As indicated above, one type of semiconductor package commonly including a leadframe is a quad flat pack (QFP) package. QFP semiconductor packages or devices are particularly advantageous for their smaller size and superior electrical performance. A typical QFP package comprises a thin, generally square package body defining four peripheral sides of substantially equal length. Protruding from each of the four peripheral sides of the package body are a plurality of leads which each have a generally gull-wing configuration. Portions of the leads are internal to the package body, and are electrically connected to respective ones of the pads or terminals of a semiconductor die also encapsulated within the package body. The semiconductor die is itself mounted to a die pad of the QFP package leadframe. In certain types of QFP packages referred to as QFP exposed pad packages, one surface of the die pad is exposed within the bottom surface of the package body.

In the electronics industry and, in particular, in high frequency applications such hard disk drives, digital television and other consumer electronics, there is an increasing need for QFP exposed pad packages of increased functional capacity, coupled with reduced size. One of the deficiencies of currently known QFP packages is attributable to the length at which the leads protrude from the sides of the package body, such protrusion length resulting in an increase in the overall size of the QFP package and further limiting the number of inputs/outputs (I/O's) which may be included therein. With recent trends toward high integration and high performance semiconductor dies, there is a need for QFP packages to have a larger number of I/O's with excellent thermal and electrical properties. In view of this need, conventional leadframe structures as currently known and integrated into existing QFP packages often prove to be unsatisfactory.

Another deficiency of existing QFP packages is the absence of power bars which are often needed for power supply or ground connection. In this regard, the semiconductor dies integrated into currently known QFP packages typically require a number of power leads and ground leads, in addition to signal leads. To reduce the number of signal leads, some of these prior art QFP packages are provided with internal power bars or ground rings which extend substantially perpendicularly relative to the signal leads. All the power supply wires are bonded and electrically connected to the power bar with all the ground wires being bonded and electrically connected to the ground rings so as to avoid the unnecessary use of the signal leads for power supply or ground. However, in currently known leadframe designs for QFP packages, the power bars and/or ground rings are often not connected to other support structures of the leadframe and thus "float," thus necessitating that they be fixed to the remainder of the leadframe through the use of, for example, lead lock tape. As will be recognized, this use of lead lock tape renders the power bars and/or ground rings structurally unstable, with such instability often leading to poor flatness relative to the signal leads. Additionally, the inclusion of power bars in currently known leadframe configurations for QFP packages often carries a significant penalty attributable to the resultant increase in size of the leadframe, and hence the QFP package including the same.

In an attempt to address some of the deficiencies highlighted above in relation to QFP packages, there has been developed in the prior art ball grid array (BGA) and pin grid array (PGA) semiconductor packages or devices which employ the use of laminate, tape, or film circuit boards as opposed to leadframes. These particular types of semiconductor packages provide a relatively large number of I/O's, such I/O's being defined by solder balls or metal pins which are formed on a lower surface of the encapsulant or package body of the package, rather than on the side surfaces of the package body. However, the circuit boards integrated into these types of semiconductor packages are expensive and typically exhibit poor heat sink and electrical performance characteristics in comparison to semiconductor packages employing leadframes. In this regard, semiconductor packages or devices employing leadframes often exhibit good heat sink performance due to the semiconductor die being directly mounted on a metal (e.g., copper) die pad of the leadframe. Further, the die pad of the leadframe can be used as a ground area to improve the electrical properties of the semiconductor package. Such a structure is difficult to achieve in a semiconductor package employing a circuit board.

The present invention provides a QFP exposed pad package which addresses the aforementioned needs by providing increased I/O and one or more internal power bars, while still achieving a reduced overall size. The QFP package of the present invention includes exposed leads and an exposed die pad on the bottom surface of the package body thereof, and additional leads which protrude from side surfaces of the package body. The QFP package of the present invention is also provided through the use of standard, low-cost leadframe design techniques. These, as well as other features and attributes of the present invention will be discussed in more detail below.

BRIEF SUMMARY OF THE INVENTION

In accordance with the present invention, there is provided a semiconductor device or semiconductor package (e.g., a QFP package) including a uniquely configured leadframe sized and configured to maximize the available number of exposed leads in the semiconductor package, and further to provide one or more power bars in the semiconductor package. More particularly, the semiconductor package of the present invention includes a generally planar die paddle or die pad defining multiple peripheral edge segments. In addition, the semiconductor package includes a plurality of leads. Some of these leads include exposed bottom surface portions which are provided in at least two concentric rows or rings which at least partially circumvent the die pad, with other leads including portions which protrude from respective side surfaces of a package body of the semiconductor package. Connected to the top surface of the die pad is at least one semiconductor die which is electrically connected to at least some of the leads. At least portions of the die pad, the power bars, leads, and the semiconductor die are encapsulated by the package body, with at least portions of the bottom surfaces of the die pad and some of the leads being exposed in a common exterior surface of the package body. The bottom surface(s) of the power bar(s) may also be exposed in such common exterior surface of the package body, or the power bar(s) may be completely covered by the package body. The leadframe of the semiconductor package is fabricated in accordance with standard, low-cost forming techniques. In accordance with the present invention, sawing, punching, etching, or other material removal processes may be completed during the fabrication of the semiconductor package to effectively electrically isolate the power bars and various leads from each other within the semiconductor package. The semiconductor package of the present invention may include one or more internal semiconductor dies, depending on functional requirements.

The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein.

Common reference numerals are used throughout the drawings and detailed description to indicate like elements.

DETAILED DESCRIPTION OF THE INVENTION

Figure 2A:
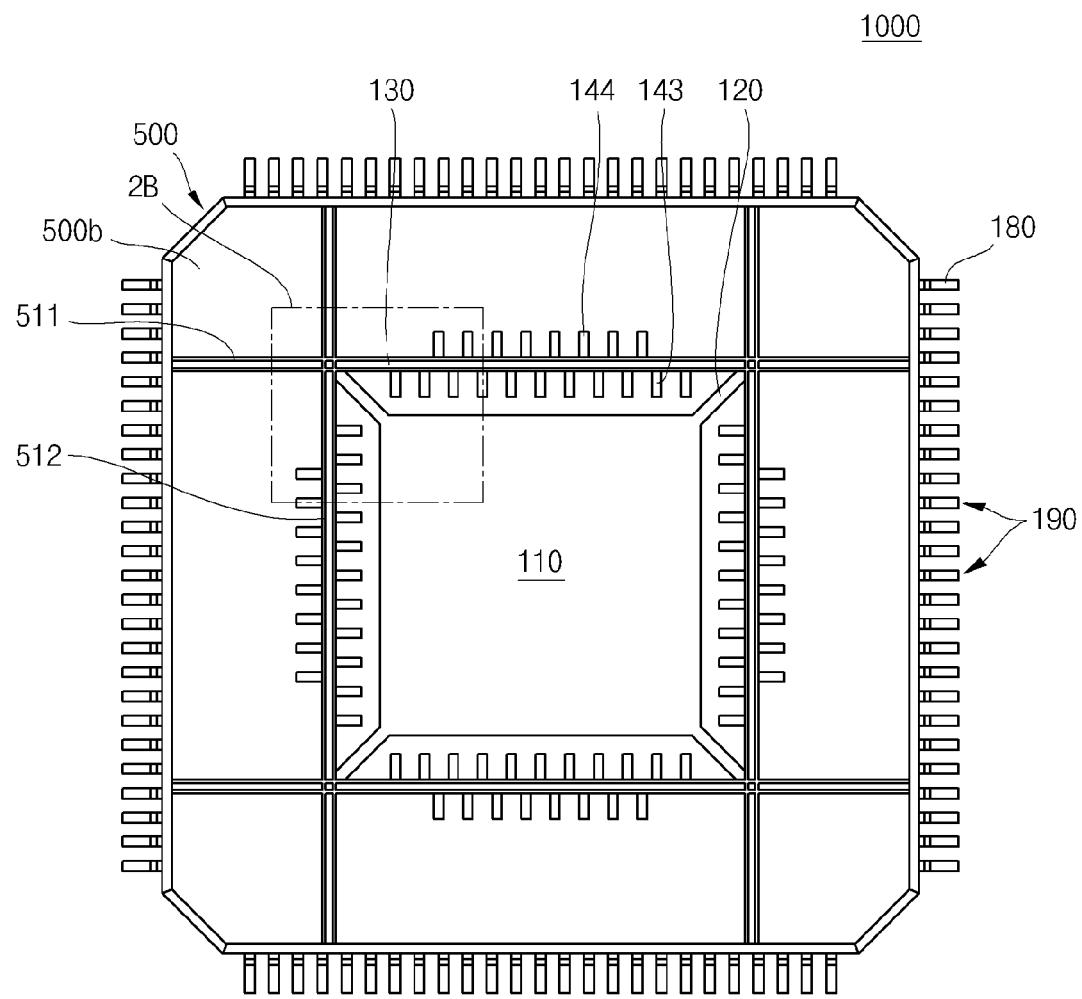
FIG. 2A is a bottom plan view of the semiconductor package shown in FIG. 1.
Figure 2B:
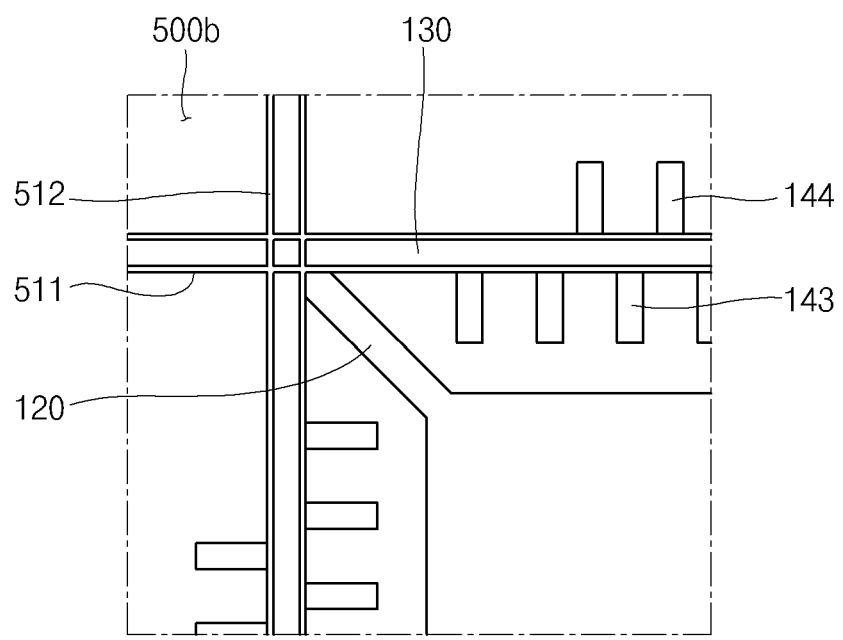
FIG. 2B is an enlargement of the region 2B included in FIG. 2A.
Figure 3:
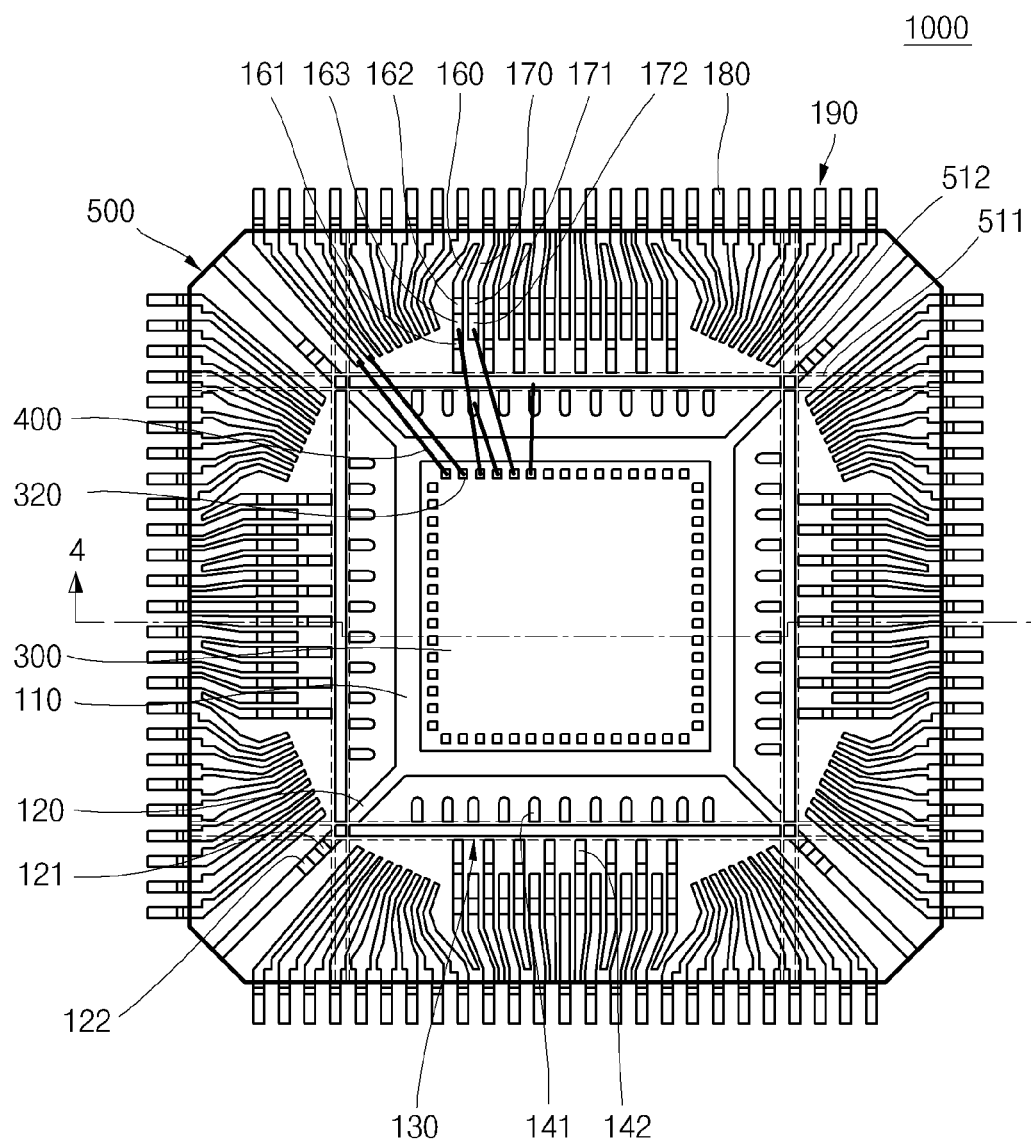
FIG. 3 is a top plan view of the semiconductor package of the first embodiment similar to FIG. 1, but including only an outline of the package body of the semiconductor package so as to depict the internal structural features thereof.

Referring now to the drawings wherein the showings are for purposes of illustrating one embodiment of the present invention only, and not for purposes of limiting the same, FIGS. 1-4 depict a semiconductor package 1000 constructed in accordance with a first embodiment of the present invention. Integrated into the semiconductor package 1000 is a leadframe 100, the structural attributes of which will be described in more detail below. In FIGS. 7B, 9B and 10B, the leadframe 100 is shown in its original, unsingulated state. In FIGS. 3 and 12B, the leadframe 100 is shown in its post-singulation, completed state.

The leadframe 100 of the semiconductor package 1000 comprises a generally quadrangular (e.g., square) die pad 110 which defines four peripheral edge segments. Integrally connected to the die pad 110 is a plurality of tie bars 120. More particularly, the leadframe 100 includes four tie bars 120 which extend diagonally from respective ones of the four corner regions defined by the die pad 110. In the leadframe 100, each of the tie bars 120 is bent to include a first downset 121 and a second downset 122. The first downset 121 of each tie bar 120 is disposed between the second downset 122 and the die pad 110. Due to the inclusion of the first and second downsets 121, 122 therein, each of the tie bars 120 includes a first segment which is disposed between the die pad 110 and the first downset 121 and extends in generally co-planar relation to the die pad 110, a second segment which extends between the first and second downsets 121, 122 and resides on a plane which is elevated above that of the die pad 110, and a third segment which extends between the second downset 122 and a dambar 150, the third segment and the dambar 150 each residing on a plane which is elevated above that of the second segment. Thus, the first, second and third segments of each tie bar 120 reside on respective ones of three spaced, generally parallel planes, with the plane upon which the second segment resides being disposed between those planes on which respective ones of the first and third segments reside.

As indicated above, the tie bars 120 are integrally connected to the dambar 150 which circumvents the die pad 110. In the leadframe 100, the dambar 150 is provided in the form of a substantially quadrangular (e.g., square) ring which interconnects the distal ends of the tie bars 120, thus resulting in the dambar 150 extending in generally co-planar relation to the third segments of the tie bars 120. As seen in FIG. 7B, when the leadframe 100 is unsingulated, the dambar 150 defines four peripheral segments which extend in spaced, generally parallel relation to respective ones of the peripheral edge segments of the die pad 110. In a fabrication process for the semiconductor package 1000 which will be described in more detail below, the dambar 150 is singulated or removed from the leadframe 100 to electrically isolate other structural features of the leadframe 100 from each other.

Figure 4:
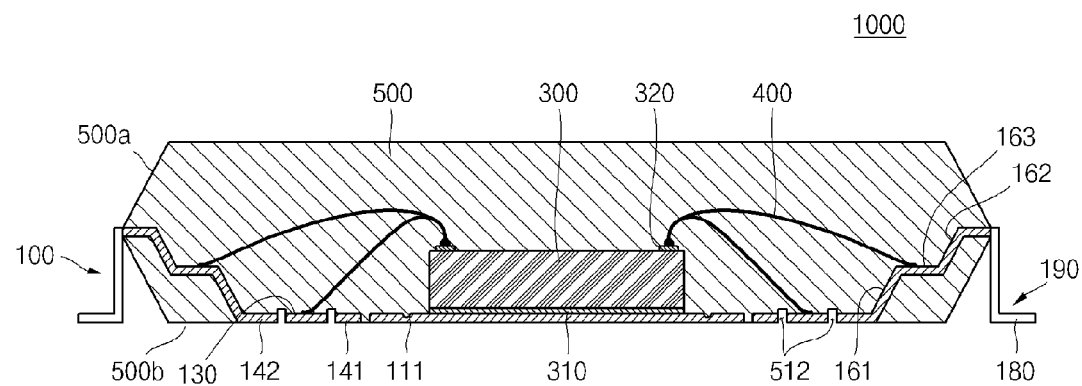
FIG. 4 is a cross-sectional view taken along line 4-4 of FIG. 3.
Figure 7A:
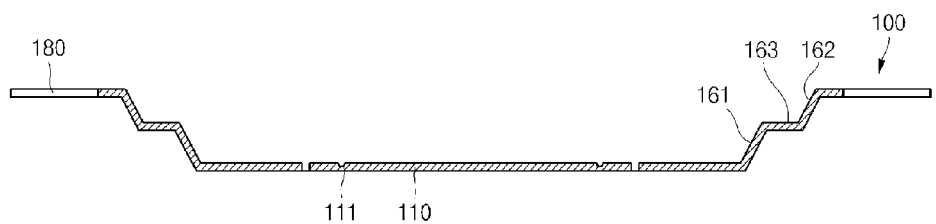
FIGS. 7A-13 are views illustrating an exemplary fabrication method for the semiconductor package of the first embodiment shown in FIGS. 1-4.
Figure 7B:
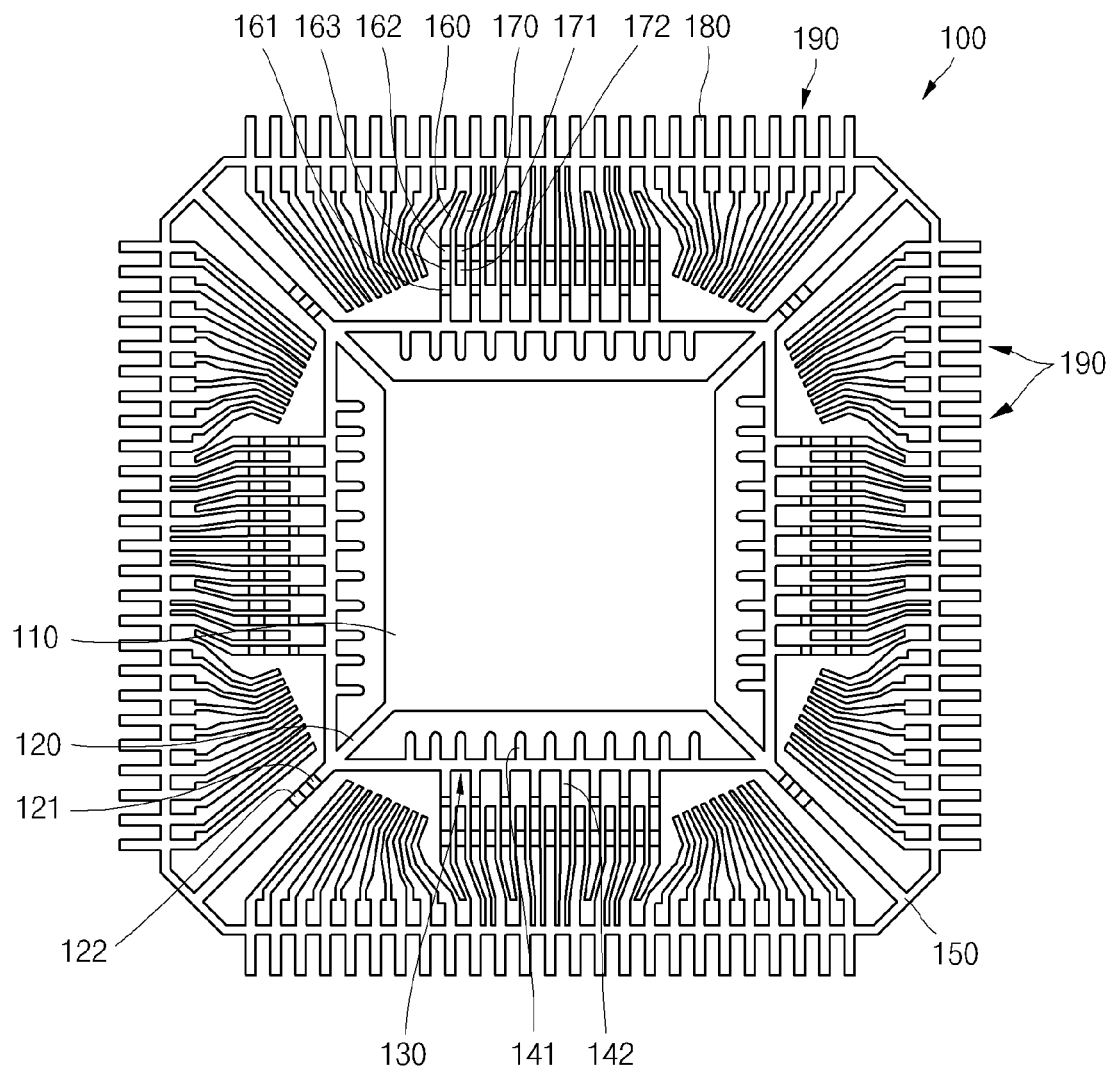

As seen in FIGS. 4 and 7A, disposed within the generally planar top surface of the die pad 110 of the leadframe 100 is a groove 111 which has a generally quadrangular (e.g., square) configuration. In this regard, the groove 111 defines four elongate sides or segments, each of which extends in parallel relation and in relative close proximity to a respective one of the peripheral edge segments of the die pad 110. The groove 111 is used to prevent adhesive from flowing outwardly to and over the peripheral edge segments of the die pad 110, as will be described in more detail below.

In addition to the die pad 110 and tie bars 120, the leadframe 100 includes a plurality (e.g., four) elongated power bars 130, each which defines opposed, generally planar top and bottom surfaces. Each of the four power bars 130 preferably included in the leadframe 100 is attached to and extends between a respective adjacent pair of the tie bars 120 in spaced, generally parallel relation to a respective one of the peripheral edge segments of the die pad 110. Thus, the power bars 130, when integrally connected to the tie bars 120, are essentially concentrically positioned between the die pad 110 and the dambar 150 in the unsingulated leadframe 100. As best seen in FIG. 7B, the opposed ends of each power bar 130 are integrally connected to the tie bars 120 of the corresponding adjacent pair thereof at locations which are disposed between the first downsets 121 of such tie bars 120 and the die pad 110. As will be described in more detail below, in the process for fabricating the semiconductor package 1000, the power bars 130 are ultimately electrically isolated from each other and from other portions of the leadframe 100.

The leadframe 100 of the present invention further comprises a plurality of first leads 141 which are each integrally connected to a respective one of the power bars 130, and protrude inwardly toward the die pad 110. More particularly, as best seen in FIGS. 3 and 7B, the first leads 141 are segregated into four sets, with each set of the first leads 141 protruding inwardly from a respective one of the power bars 130 toward the die pad 110. The first leads 141 of each set are arrange at a predetermined pitch and protrude perpendicularly inward at a predetermined length from a respective one of the power bars 130. Each of the first leads 141 has a generally planar top surface which extends in generally co-planar relation to the top surface of the die pad 110, and a generally planar bottom surface which extends in generally co-planar relation to the bottom surface of the die pad 110 and defines a land 143 as shown in FIG. 2A. Though not shown, it is contemplated that each of the first leads 141 may be formed to include one or more integral locking protrusions which may be formed by half-etching.

The leadframe 100 of the semiconductor package 1000 further comprises a plurality of second leads 160 which are each integrally connected to a respective one of the power bars 130 and extend outwardly toward the dambar 150. More particularly, the second leads 160 are segregated into four sets, with the second leads 160 of each set being integrally connected to and extending generally perpendicularly outward from a respective one of the power bars 130. The second leads 160 of each set are arranged at a predetermined pitch and protrude perpendicularly outward at a predetermined length from a respective one of the power bars 130.

As seen in FIGS. 3, 4, 7A and 7B, each of the second leads 160 is bent to include a first downset 161 and a second downset 162. The first downset 161 of each second lead 160 is disposed between the second downset 162 and the die pad 110. Due to the inclusion of the first and second downsets 161, 162 therein, each of the second leads 160 includes a first segment 142 which is disposed between the die pad 110 and the first downset 161, and extends in generally co-planar relation to the die pad 110, a second segment which extends between the first and second downsets 161, 162 and resides on a plane which is elevated above that of the die pad 110, and a third segment which extends between the second downset 162 and the dambar 150 and resides on a plane which is elevated above that of a second segment. Thus, the first segment 142, the second segment and the third segment of each second lead 160 reside on respective ones of three spaced, generally parallel planes, with the plane upon which the second segment resides being disposed between those planes on which respective ones of the first segment 142 and the third segment reside.

The generally planar bottom surface of the first segment 142 of each second lead 160 defines a land 144 as shown in FIG. 2A. Thus, such land 144 extends to the inner, distal end of the second lead 160 defined by the first segment 142 thereof. Additionally, the land 144 defined by each second lead 160 extends in generally co-planar relation to the generally planar bottom surface of the die pad 110, and further extends in generally co-planar relation to the land 143 defined by each first lead 141. Along these lines, the first segment 142 of each second lead 160 further defines a generally planar top surface which extends in generally co-planar relation to the generally planar top surface of the die pad 110, and also to the generally planar top surfaces of the first leads 141. The third segment of each second lead 160 extends in generally co-planar relation to the dambar 150. As best seen in FIG. 2A, the lands 143 defined by the first leads 141 of each set are staggered or offset relative to the lands 144 defined by the second leads 160 of the corresponding set, the lands 143, 144 each being exposed in and substantially flush with an exterior surface defined by the package body of the semiconductor package 1000 so as to be electrically connectable to an underlying substrate such as a printed circuit board.

In addition to defining the land 144, each of the second leads 160 further includes a wire bonding area 163 defined by the top surface of the second segment thereof which, as indicated above, extends between the first and second downsets 161, 162. Thus, as will be recognized, the wire bonding area 163 is situated at a higher level than the die pad 110. As will be discussed in more detail below, the wire bonding area 163 of each of the second leads 160 provides an area for the electrical bonding of conductive wires. For ease of the wire bonding, the wire bonding area 163 of each second lead 160 may be plated with gold or silver, or the leadframe 100 may be pre-plated (i.e., a pre-plated frame or PPF).

In the leadframe 100, some of the second leads 160 are integrally connected to the dambar 150, with other ones of the second leads 160 terminating so as to be disposed in spaced relation to the dambar 150. For those second leads 160 integrally connected to the dambar 150, the third segments of such second leads 160 include tie bar portions which facilitate the integral connection thereof to the dambar 150. The integral connection of some of the second leads 160 to the dambar 150 through the use of tie bar portions functions to maintain the flatness of the power bars 130, the first leads 141 and the second leads 160. When the dambar 150 is removed in a subsequent fabrication step for the semiconductor package 1000, the tie bar portions of the second leads 160 including the same do not protrude from the package body of the semiconductor package 1000. Accordingly, such tie bar portions can be electrically connected to an external device only via the land 144 of the corresponding second lead 160. Additionally, in the leadframe 100, the second leads 160 of each set are preferably formed so as to be staggered or offset relative to the land leads 141 of the corresponding set thereof, as seen in FIGS. 3 and 7B.

The leadframe 100 constructed in accordance with the present invention further comprises a plurality of third leads 190 which are integrally connected to the dambar 150 and extend generally perpendicularly relative thereto. The third leads 190, like the first and second leads 141, 160, are preferably segregated into four sets, with each set of the third leads 190 extending between an adjacent pair of the tie bars 120. Each of the third leads 190 includes an inner portion 170 which extends from the dambar 150 inwardly toward the die pad 110 in spaced relation thereto. More particularly, the inner portions 170 of the third leads 190 of each set extend generally perpendicularly relative to a respective one of the peripheral segments of the dambar 150 at a predetermined length toward the die pad 110, the inner portions 170 of each set also being arranged at a predetermined pitch. Additionally, certain ones of the inner portions 170 of each set have a generally linear configuration, and extend between a respective, adjacent pair of the second leads 160 in spaced relation thereto. Those inner portions 170 of each set which do not extend between an adjacent pair of the second leads 160 each preferably have an angled configuration so as to be disposed closer to a respective one of the peripheral edge segments of the die pad 110.

In the leadframe 100, each of the inner portions 170 which extends between an adjacent pair of the second leads 160 is preferably bent to include a downset 171. In this regard, each of the inner portions 170 including a downset 171 therein defines a first segment which is disposed between the downset 171 and a respective one of the power bars 130, and a second segment which extends between the downset 171 and the dambar 150. The first segments of the inner portions 170 including a downset 171 preferably reside on the same plane as the second segments of the second leads 160. Similarly, the second segments of the inner portions 170 including a downset 171, as well as the inner portions 170 not including a downset 171, preferably reside on the same plane as the third segments of the second leads 160 and the dambar 150. In this regard, each of the inner portions 170 including a downset 171 has a wire bonding area 172 which is defined by the top surface of the first segment thereof and extends from the downset 171 to the distal end of the inner portion 170 defined by the first segment. The wire bonding areas 172 of the inner portions 170 extend in generally co-planar relation to the wire bonding areas 163 of the second leads 160. Like the wire bonding areas 163 of the second leads 160, the wire bonding areas 172 of the inner portions 170 of the third leads 190 provide areas for the electrical bonding of conductive wires, as will be described in more detail below. It is contemplated that for ease of wire bonding, gold or silver may be plated on the wire bonding areas 172 as well. Alternatively, as indicated above, the leadframe 100 may be a pre-plated leadframe (PPF) to provide enhanced wire bonding areas.

In addition to the inner portions 170, each of the third leads 190 of the leadframe 100 constructed in accordance with the present invention comprises an outer portion 180 which extends from the dambar 150 outwardly away from the die pad 110. More particularly, the outer portions 180 of each set of the third leads 190 extend generally perpendicularly relative to a respective one of the peripheral segments of the dambar 150 in a predetermined length. The outer portions 180 of each set are also arranged at a predetermined pitch, and are preferably linearly aligned with respective ones of the inner portions 170. In the leadframe 100, the outer portions 180 of the third leads 190, the dambar 150, the second segment of the inner portions 170 including a downset 171, the inner portions 170 not including a downset 171, and the third segments of the second leads 160 all reside on a common plane. In the process of fabricating the semiconductor package 1000 as will be described in more detail below, the dambar 150 is ultimately singulated in a manner wherein each outer portion 180 remains integrally connected to a respective one of the inner portions 170, with each connected pair of the inner and outer portions 170, 180 being electrically isolated from every other connected pair thereof. Stated another way, the dambar 150 is singulated in a manner facilitating the electrical isolation of the third leads 190 from each other, and from those second leads 160 connected to the dambar 150 by the above-described tie bar portions.

The leadframe 100 may be fabricated from a conventional metal material, such as copper, copper alloy, steel plated with copper, or a functional equivalent. However, those of ordinary skill in the art will recognize that the present invention is not limited to any particular material for the leadframe 100. Additionally, the number of first leads 141, second leads 160, third leads 190 shown in FIGS. 3 and 7B is for illustrative purposed only, and may be modified according to application field. Along these lines, the first leads 141, second leads 160, third leads 190 may have designs or configurations varying from those shown in FIGS. 3 and 7B without departing from the spirit and scope of the present invention. Additionally, though the first leads 141, second leads 160, third leads 190 are each shown as being segregated into four sets, it will be recognized that fewer sets thereof may be provided, and may be arranged along any combination of two or three of the peripheral sides of the die pad 110. Moreover, less than four tie bars 120 may be included in the leadframe 100, extending to respective corners of the die pad 110 in any combination. It is further contemplated that the leadframe 100 may be fabricated through the implementation of a chemical etching process or alternatively a mechanical stamping process.

In the semiconductor package 1000, a semiconductor die 300 is attached to the top surface of the die pad 110 through the use of an adhesive layer 310. The semiconductor die 300 includes a plurality of bond pads 320 which are disposed on the top surface thereof opposite the bottom surface adhered to the adhesive layer 310. The bond pads 320 are used to deliver and receive electrical signals. As previously indicated, the groove 111 disposed in the top surface of the die pad 110 is used to prevent adhesive layer 310 from flowing outwardly to and over the peripheral edge segments of the die pad 110.

The semiconductor package 1000 further comprises a plurality of conductive wires 400 which are used to electrically connect the bond pads 320 of the semiconductor die 300 to respective ones of the first leads 141, the second leads 160 and the third leads 190. One or more conductive wires 400 may also be used to facilitate the electrical connection one or more bond pads 320 of the semiconductor die 300 to one or more of the power bars 130. The conductive wires 400 may be fabricated from aluminum, copper, gold, silver, or a functional equivalent. However, those of ordinary skill in the art will recognize that the present invention is not limited to any particular material for the wires 400. One or more conductive wires 400 may also be used to electrically connect one or more bond pads 320 of the semiconductor die 300 directly to the die pad 110. In this regard, though not shown, the peripheral edge portion of the top surface or the entire top surface of the die pad 110 may be plated and bonded with conductive wires 400, allowing for the use of the plated die pad 110 as a ground region.

In the semiconductor package 1000, in electrically connecting the bond pads 320 to the first leads 141, it is contemplated that the conductive wires 400 will be extended from the bond pads 320 to the top surfaces defined by the first leads 141. In electrically connecting the bond pads 320 to the second leads 160, it is contemplated that the conductive wires 400 will be extended from the bond pads 320 to the wire bonding areas 163 defined by the second segments of respective ones of the second leads 160. However, it is contemplated that the electrical connection of the bond pads 320 of the semiconductor die 300 to the second leads 160 may be facilitated by extending the conductive wires 400 between the bond pads 320 and the top surfaces of the first segments of respective ones of the second leads 160. The electrical connection of the bond pads 320 of the semiconductor die 300 to the third leads 190 is preferably facilitated by extending the conductive wires 400 from the bond pads 320 to the wire bonding areas 172 defined by the first segments of respective ones of those inner portions 170 including downsets 171, and to the top surfaces of those inner portions 170 not including downsets 171. Since the wire bonding areas 163 of the second leads 160 extend in generally co-planar relation to the wire bonding areas 172 of the inner portions 170 of the third leads 190, the conductive wires 400 can be bonded to the wire bonding areas 163, 172 by repeatedly reciprocating capillaries at the same height to maintain constant wiring bonding quality. In electrically connecting the bond pads 320 to the power bars 130, it is contemplated that one or more conductive wires 400 will be extended from one or more bond pads 320 to the top surface(s) of one or more of the power bars 130.

In the semiconductor package 1000, the die pad 110, the first leads 141, the tie bars 120, the power bars 130, the second leads 160, the inner portions 170 of the third leads 190, the semiconductor die 300 and the conductive wires 400 are at least partially encapsulated or covered by an encapsulant material which, upon hardening, forms the package body 500 of the semiconductor package 1000. More particularly, the package body 500 covers the entirety of the die pad 110 except for the bottom surface thereof. The package body 500 also covers the entirety of each of the first leads 141 except for the land 143 defined thereby, as well as the entirety of each of the second leads 160 except for the land 144 defined thereby and a small portion of the third segment thereof. The package body 500 also covers the entirety of each of the inner portions 170 of the third leads 190 except for a small portion of the second segment thereof. The entirety of each of the tie bars 120 is also covered by the package body 500, except for the bottom surface of the first segment of each tie bar 120 which extends in generally co-planar relation to the bottom surface of the die pad 110 and the lands 143, 144 defined by the first and second leads 141, 160, all of which are exposed in a generally planar bottom surface 500b defined by the package body 500. The outer portions 180 of the third leads 190 are not covered by the package body 500, but rather protrude or extend outwardly from respective lateral side surfaces 500a thereof. The dambar 150 is also not covered by the package body 500 so that it may be removed from the leadframe 100.

Though the power bars 130 are each partially covered by the package body 500, the bottom surfaces of the power bars 130 are exposed in the bottom surface 500b so that portions thereof, like the dambar 150, may be removed from the completed semiconductor package 1000 as needed to facilitate the electrical isolation of various structural features thereof from each other. More particularly, the removal of portions of the power bars 130 is needed to facilitate the electrical isolation of the power bars 130 from the tie bars 120, the first leads 141 from each other and from the second leads 160, and further to facilitate the electrical isolation of the second leads 160 from each other.

As shown in FIGS. 2A and 3, the removal of portions of the power bars 130, which is typically accomplished through the completion of a partial sawing process which will be described in more detail below, facilitates the formation of a plurality of elongate sawing grooves 511, 512 within the bottom surface 500b of the package body 150. The grooves 511 extend in spaced, generally parallel relation to each other and between a corresponding opposed pair of the lateral side surfaces 500a of the package body 500. Similarly, the grooves 512 extend in spaced, generally parallel relation to each other between a corresponding opposed pair of the lateral side surfaces 500a of the package body 500, and further in generally perpendicular relation to the grooves 511.

More particularly, as best seen in FIG. 3, the grooves 511 are formed along respective ones of the opposed sides of the power bars 130 of one of the pairs thereof which extend in spaced, generally parallel relation to each other. Similarly, the grooves 512 are formed along respective ones of the opposed sides of the power bars 130 of the remaining pair thereof which extend in spaced, generally parallel relation to each other. That is, double cut sawing is performed along both sides of each of the four power bars 130 included in the leadframe 100 using a blade. The grooves 511, 512 are formed deeper than the thickness of the leadframe 100 as needed to effectively separate the power bars 130 from the die pad 110, the tie bars 120, the first leads 141 and the second leads 160 which, as previously explained, are each integrated with the power bars 130 before sawing. The sawing also separates, and thus electrically isolates, the individual power bars 130 from each other. Thus, as a result of the sawing, coupled with the removal of the dambar 150, the die pad 110, the power bars 130, the first leads 141, the second leads 160 and the third leads 190 are electrically isolated from each other. The power bars 130 can be used as a power supply or as ground terminals.

Figure 1:
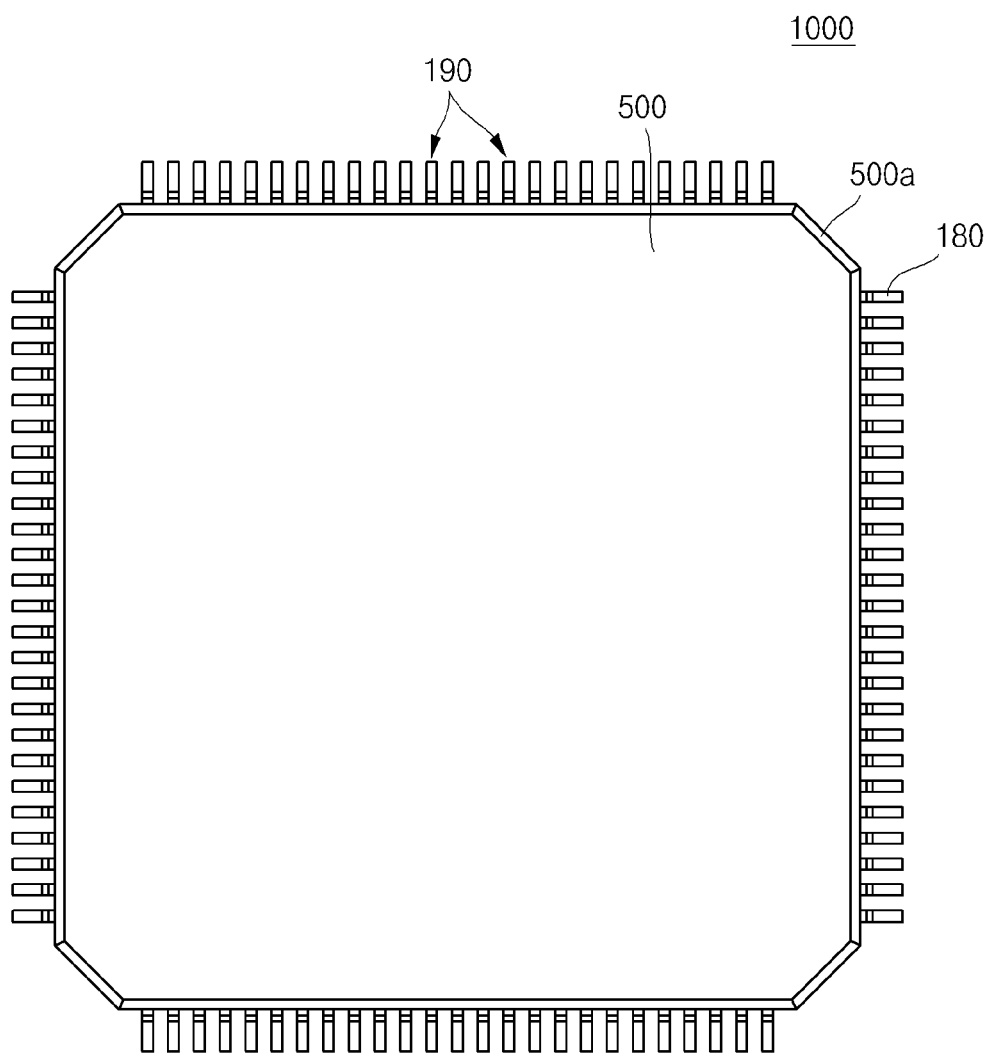
FIG. 1 is a top plan view of a semiconductor package constructed in accordance with a first embodiment of the present invention.

Due to the structural attributes of the fully formed package body 500, the generally planar bottom surface of the die pad 110 is exposed in and substantially flush with the generally planar bottom surface 500b of the package body 500, as are the generally planar bottom surfaces of the first segments of the tie bars 120 and the bottom surfaces of the power bars 130. Similarly, the generally planar lands 142, 143 defined by the first and second leads 141, 160 are exposed in and substantially flush with the bottom surface 500b of the package body 500. The outer portions 180 of the third leads 190 of each set thereof protrude laterally outward from respective side surfaces 500a of the package body 500. As seen in FIGS. 1 and 4, the exposed outer portions 180 may be bent to assume a gull-wing configuration to allow the same to be electrically connected to an underlying substrate such as a printed circuit board. As indicated above, in order to complete the fabrication of the semiconductor package 1000 to allow the same to assume the configuration shown in FIGS. 1 and 4, the dambar 150 and portions of the power bars 130 must each be removed from the leadframe 100 to facilitate the electrical isolation of the first leads 141, the second leads 160, the third leads 190 from each other as explained above. In this regard, it is contemplated that a conventionally known debarring process may be implemented to remove the dambar 150. The completion of such debarring process results in those second leads 160 originally attached to the dambar 150 by a tie bar portion defining an outer, distal end which is exposed in and substantially flush with a respective side surface 500a defined by the package body 500. As previously explained, the removal of portions of the power bars 130 is facilitated by sawing with a blade, the grooves 511, 512 being formed as an artifact of such sawing process.

Figure 13:
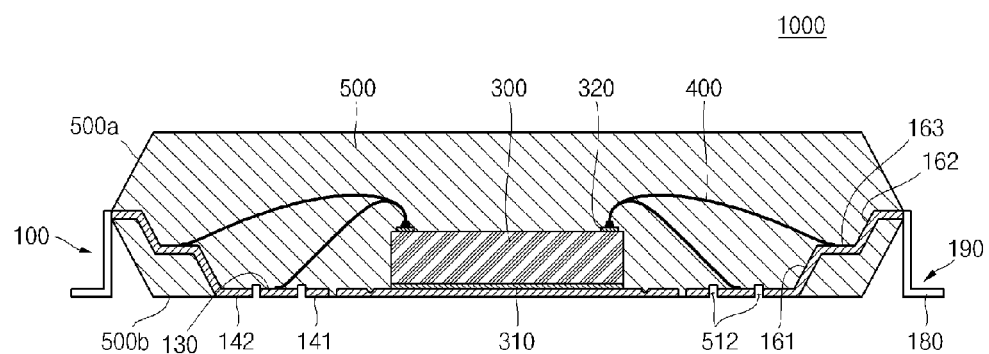

Referring now to FIGS. 1, 2A and 13, in the completed semiconductor package 1000, the dambar 150 and the portions of the power bars 130 each singulated or removed from the leadframe 100 to facilitate the electrical isolation of the various structural features of the leadframe 100 from each other as explained above. More particularly, the dambar 150 and portions of the power bars 130 are singulated in a manner wherein each outer portion 180 remains integrally connected to a respective one of the inner portions 170, with the third leads 190 defined by each connected pair of the inner and outer portions 170, 180 being electrically isolated from every other connected pair thereof. The singulation of the dambar 150 and portions of the power bars 130 also occur in a manner wherein the second leads 160 are electrically isolated from each other, from the power bars 130, from the first leads 141 and from the third leads 190, with the first leads 141 being electrically isolated from each other, from the power bars 130, from the second leads 160 and from the third leads 190. The power bars 130 are also electrically isolated from each other and from the tie bars 120.

As indicated above, the outer portions 180 of the third leads 190 are exposed in the semiconductor package 1000, as are the lands 143, 144 defined by the first and second leads 141, 160. As a result, the lands 143, 144 are capable of being mounted to the surface of an underlying substrate such as a printed circuit board through the use of, for example, a soldering technique. Electrical signals are routed between the lands 143, 144 and the semiconductor die 300 by the corresponding first and second leads 141, 160 and conductive wires 400. Similarly, electrical signals may be routed from the semiconductor die 300 to the outer portions 180 of the third leads by the corresponding integrally connected inner portions 170 and conductive wires 400. Like the lands 143, 144, the outer portions 180 may be surface mounted to an underlying substrate such as a printed circuit board through the use of, for example, a soldering technique. Since the leadframe 100 of the semiconductor package 1000 is configured to provide the outer portions 180 which protrude from the side surfaces 500a of the package body 500 and the lands 143, 144 which are exposed in the bottom surface 500b of the package body 500, the number of I/O's in the leadframe 100 increases in proportion to the number of the third leads 190 and the lands 143, 144. The exposure of the bottom surface of the die pad 110 in the bottom surface 500b of the package body 500 effectively dissipates heat generated by the semiconductor die 300 to the external environment. Additionally, the substantial circumvention of the die pad 110 by the power bars 130 simplifies the process of electrically connecting one or more bond pads 320 of the semiconductor die 300 to one or more of the power bars 130 through the use of one or more of the conductive wires 400.

Figure 6:
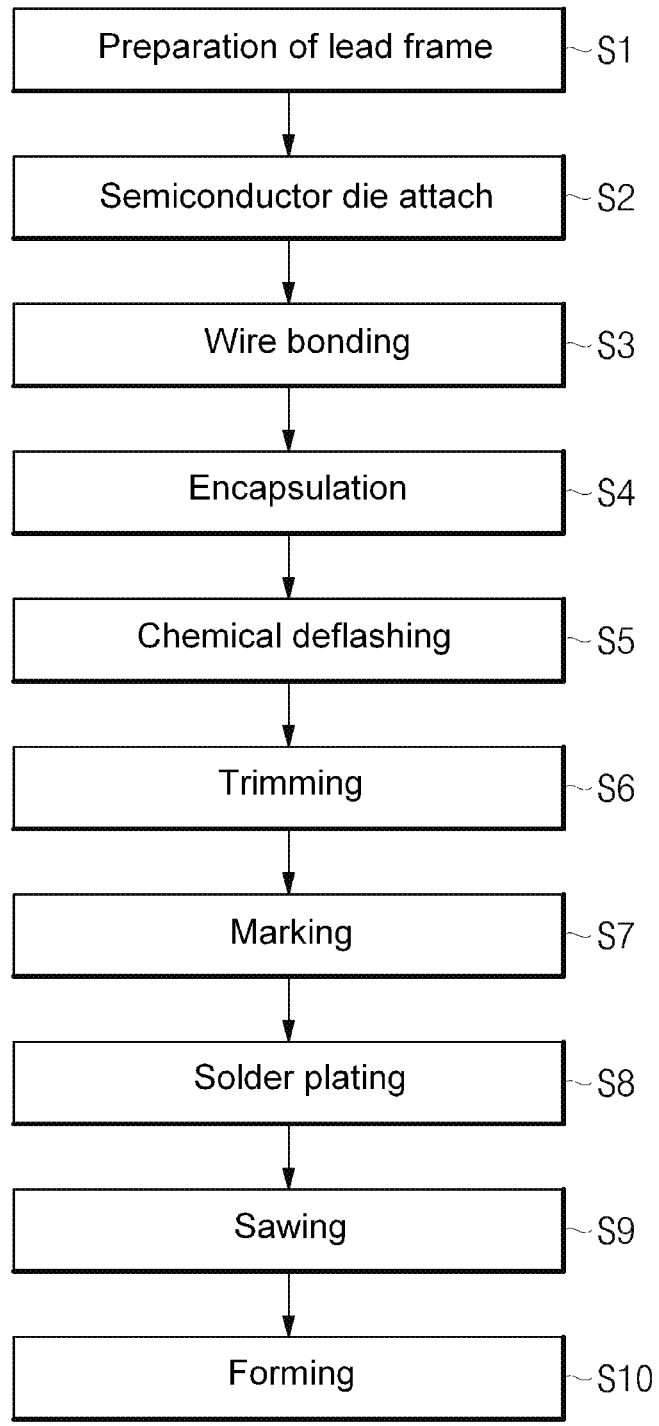
FIG. 6 is a flow chart illustrating an exemplary fabrication method for the semiconductor package of the first embodiment shown in FIGS. 1-4.

Referring now to FIG. 6, there is provided a flow chart which sets forth an exemplary method for fabricating the semiconductor package 1000 of the present invention. The method comprises the steps of preparing the leadframe (S1), semiconductor die attachment (S2), wire bonding (S3), encapsulation (S4), chemical deflashing (S5), trimming (S6), marking (S7), solder plating (S8), sawing (S9) and forming (S10). FIGS. 7A-13 provide illustrations corresponding to these particular steps, as will be discussed in more detail below.

Figure 8:
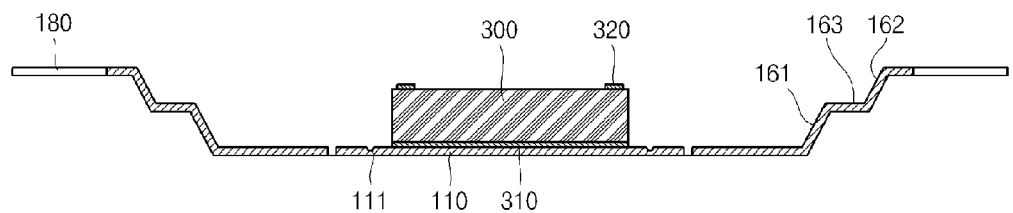

Referring now to FIGS. 7A and 7B, in the initial step S1 of the fabrication process for the semiconductor package 1000, the leadframe 100 having the above-described structural attributes is provided. Thereafter, as illustrated in FIG. 8, step S2 is completed wherein the semiconductor die 300 having the bond pads 320 is attached to the top surface of the die pad 110 of the leadframe 100 through the use of the adhesive layer 310. The adhesive layer 310 can be selected from well known liquid epoxy adhesives, adhesive films and adhesive tapes, as well as equivalents thereto.

Figure 9A:
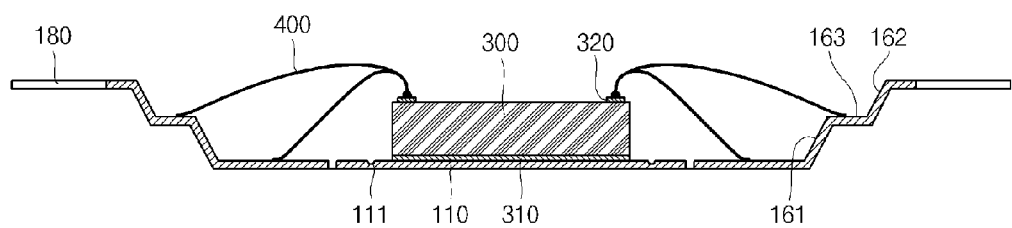
Figure 9B:
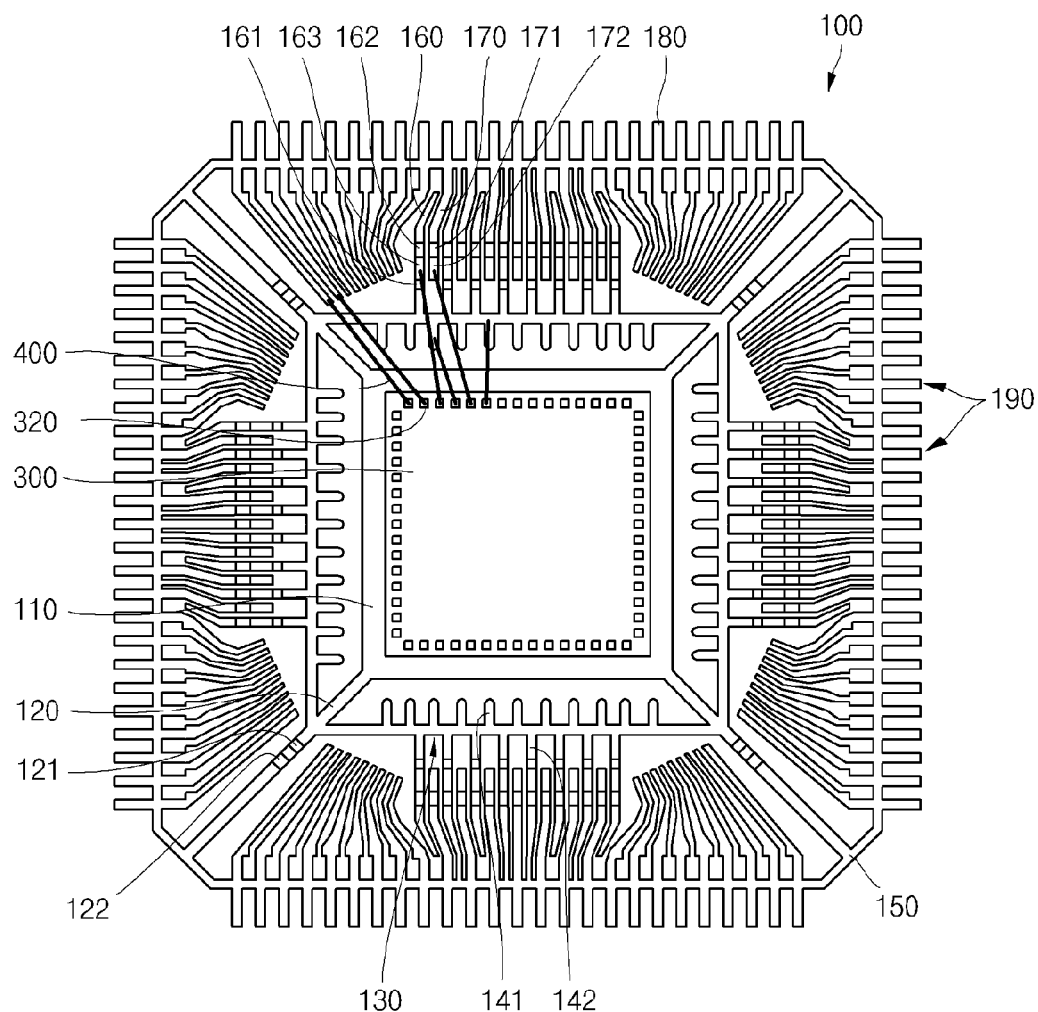

Referring now to FIGS. 9A and 9B, in the next step S3 of the fabrication process, the conductive wires 400 are used to electrically interconnect the semiconductor die 300 to the leadframe 100 in the aforementioned manner. Specifically, the bond pads 320 of the semiconductor die 300 are electrically connected to at least some of the first leads 141, at least some of the second leads 160, at least some of the third leads 190 and at least one of the power bars 130 in the above-described manner. Though not shown, as also indicated above, one or more conductive wires 400 may also be used to electrically connect one or more bond pads 320 of the semiconductor die 300 directly to the die pad 110 at a peripheral location of the top surface of the die pad 110 outward of the groove 111, thus allowing for the use of the die pad 110 as a ground region as well.

Figure 10A:
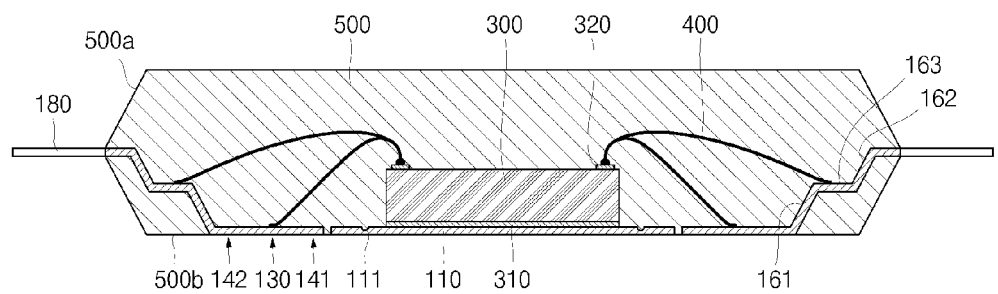
Figure 10B:
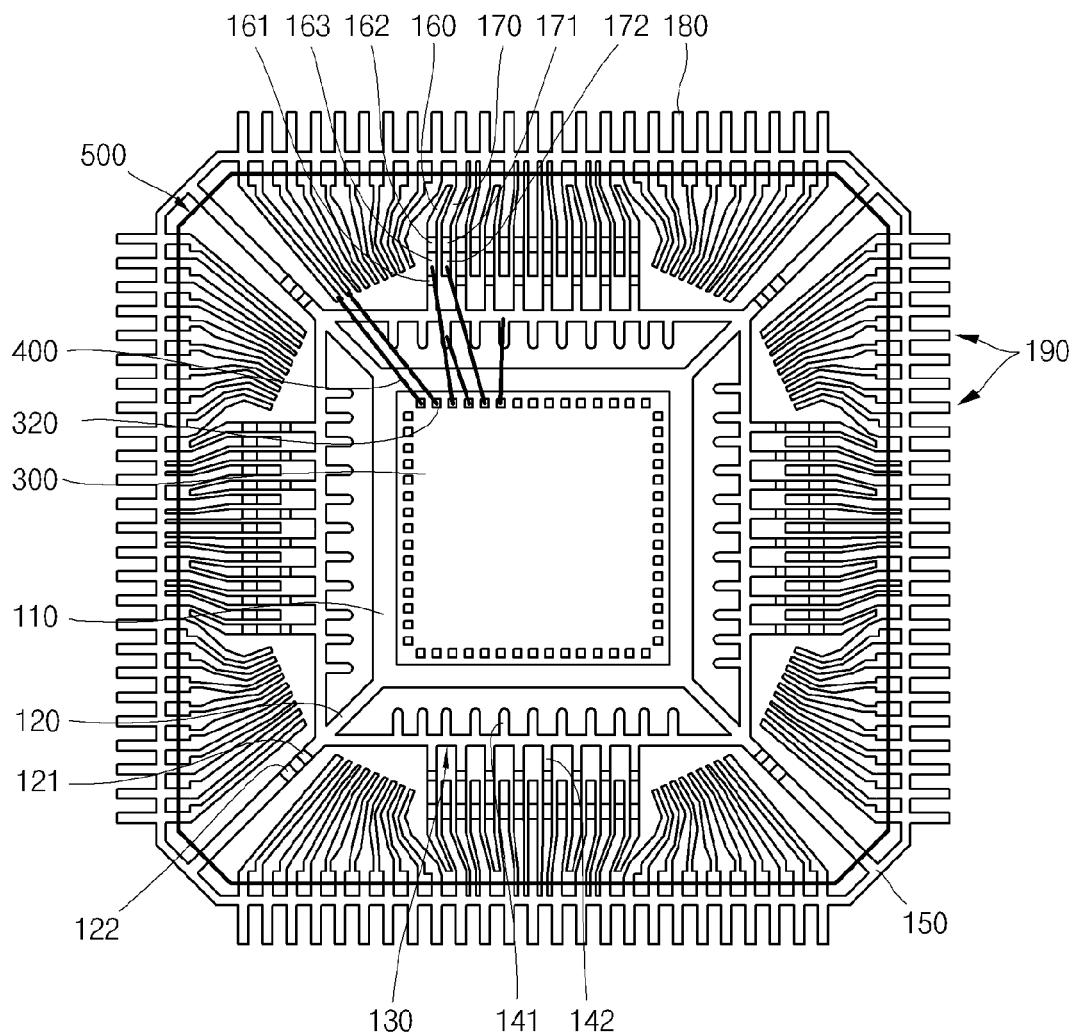

Referring now to FIGS. 10A and 10B, in the next step S4 of the fabrication process for the semiconductor package 1000, portions of the leadframe 100, the semiconductor die 300 and the conductive wires 400 are encapsulated with an encapsulant material which, upon hardening, forms the package body 500 of the semiconductor package 1000. More particularly, the package body 500 covers the entirety of the die pad 110 except for the bottom surface thereof. The package body 500 also covers the entirety of each of the first leads 141 except for the land 143 defined thereby, as well as the entirety of each of the second leads 160 except for the land 144 defined thereby and a small portion of the third segment thereof. The package body 500 also covers the entirety of each of the inner portions 170 of the third leads 190 except for a small portion of the second segment thereof. The entirety of each of the tie bars 120 is also covered by the package body 500, except for the bottom surface of the first segment of each tie bar 120 which extends in generally co-planar relation to the bottom surface of the die pad 110 and the lands 143, 144 defined by the first and second leads 141, 160, all of which are exposed in the bottom surface 500b of the package body 500. The outer portions 180 of the third leads 190 are not covered by the package body 500, but rather protrude or extend outwardly from respective lateral side surfaces 500a thereof. The dambar 150 is also not covered by the package body 500 so that it may be removed from the leadframe 100.

Subsequent to the formation of the package body 500 in step S4, chemical deflashing (step S5) may be performed if films of flash (a resin component of the encapsulant material) are formed on the bottom surface of the die pad 110 and upon the lands 143, 144. If such thin films of flash are present as could impede the ability to mount the semiconductor package 1000 to an underlying substrate, the removal of such flash films by a chemical etching method is required.

Figure 11A:
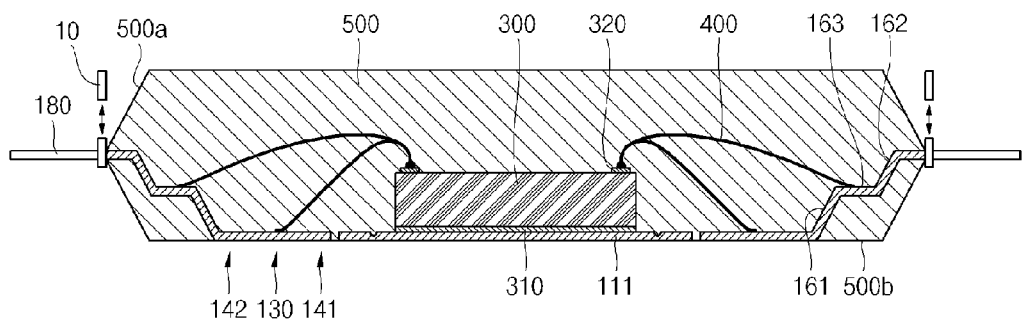
Figure 11B:
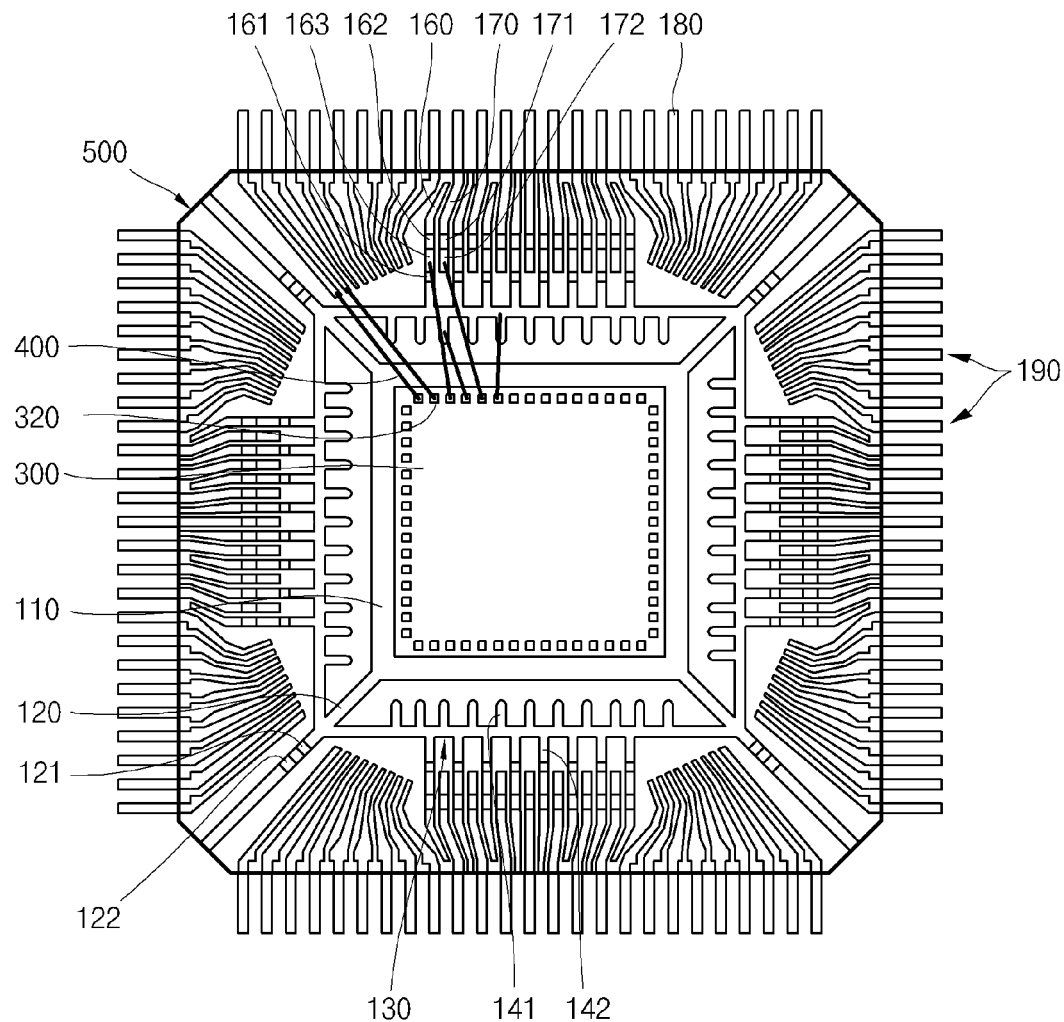

Referring now to FIGS. 11A and 11B, in the next step S6 of the fabrication process for the semiconductor package 1000, the dambar 150 is trimmed or removed by cutting with a cutting tool 10 so that the second leads 160 and the third leads 190 are electrically isolated from each other in the above described manner. As previously explained, the dambar 150 is positioned outside of the package body 500 to allow for the removal thereof from the leadframe 100, and is removed by cutting the same with the dambar cutting tool 10. In addition, portions of the second leads 160 (i.e., the tie bar portions of the second leads 160 including the same) and tie bars 120 protruding from the side surfaces 500a of the package body 500 are also completely removed during the trimming process.

Upon the completion of step S6, a marking step (step S7) may be performed upon the semiconductor package 1000. More particularly, ink or a laser may be used to mark the product name, the manufacturer of the semiconductor package 1000, etc. on a prescribed surface of the package body 500. Subsequent to the completion of any such marking step (step S7), a solder plating step (step S8) may also be performed in the fabrication process for the semiconductor package 1000. More particularly, after the dambar 150 and portions of certain ones of the extension leads 160 have been removed using the dambar cutting tool 10, some metal areas of the leadframe 100 susceptible to oxidation are exposed to air. Since the leadframe 100 is typically made of copper, the same is susceptible to oxidation. In order to prevent the oxidation of the exposed metal areas of the leadframe 100, all elements of the leadframe 100 exposed outside of the package body 500 may be plated by soldering. If the leadframe 100 is pre-plated, this particular plating step S8 may be omitted.

Figure 12A:
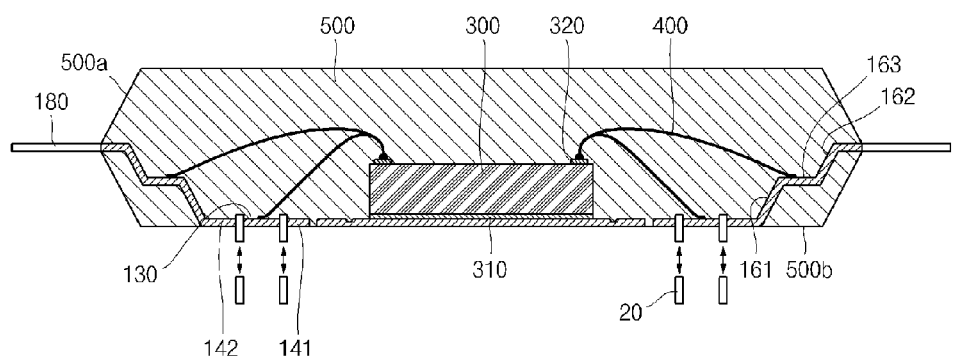
Figure 12B:
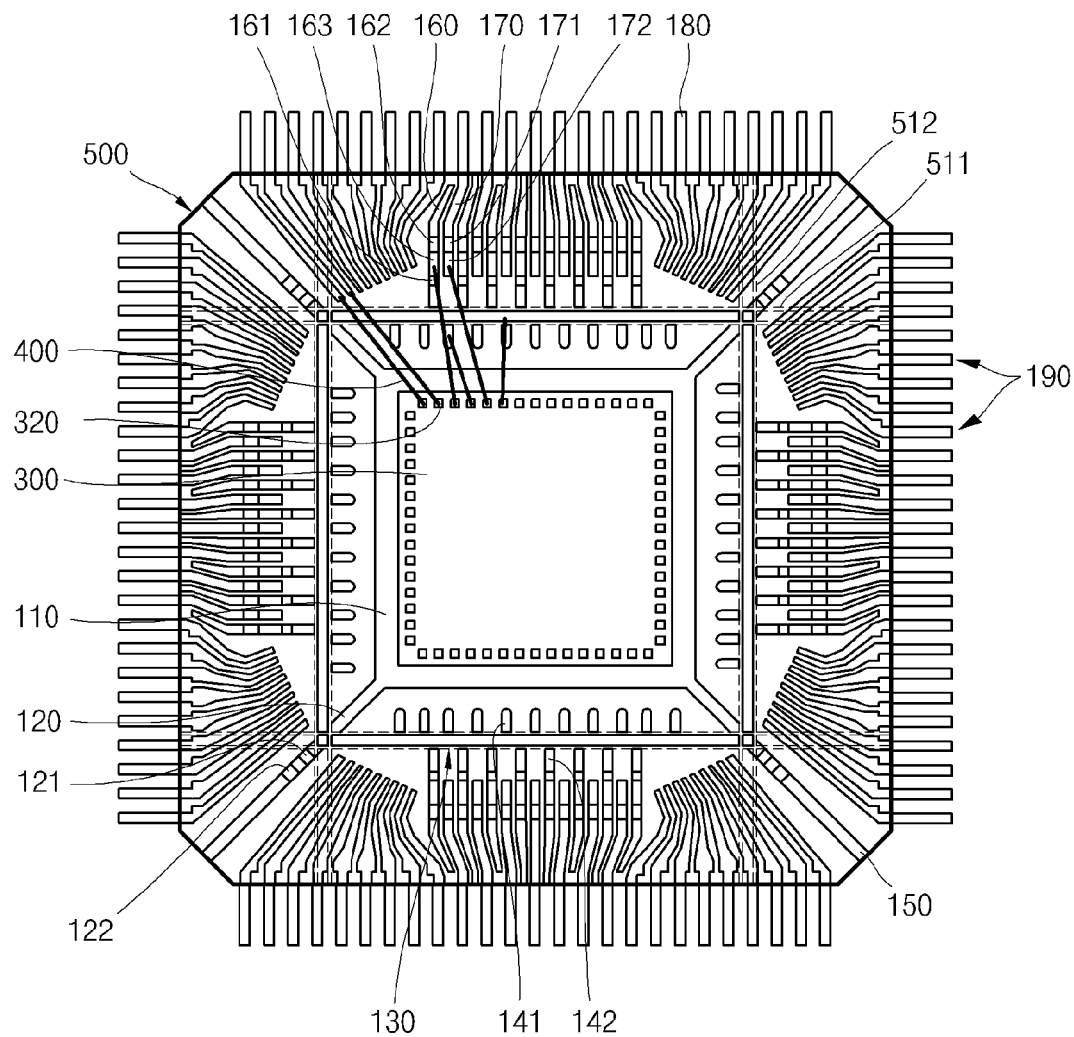

Referring now to FIGS. 12A and 12B, in the next step S9 of the fabrication process for the semiconductor package 1000, the removal of portions of the power bars 130 in the above-described manner is facilitated by sawing with a blade 20, the grooves 511, 512 being formed as an artifact of such sawing process. As previously explained, the grooves 511 are formed along respective ones of the opposed sides of the power bars 130 of one of the pairs thereof which extend in spaced, generally parallel relation to each other. Similarly, the grooves 512 are formed along respective ones of the opposed sides of the power bars 130 of the remaining pair thereof which extend in spaced, generally parallel relation to each other. The grooves 511, 512 are formed deeper than the thickness of the leadframe 100 as needed to effectively separate the power bars 130 from the die pad 110, the tie bars 120, the first leads 141 and the second leads 160. The sawing also separates, and thus electrically isolates, the individual power bars 130 from each other. Thus, as a result of the sawing, coupled with the removal of the dambar 150, the die pad 110, the power bars 130, the first leads 141, the second leads 160 and the third leads 190 are electrically isolated from each other. In the semiconductor package 1000, the power bars 130 can be used as a power supply or as ground terminals.

Referring now to FIG. 13, in the last step S10 of the fabrication process for the semiconductor package 1000, the outer portions 180 of the third leads 190 protruding from the package body 500 are formed in appropriate shapes. Specifically, the exposed outer portions 180 protruding from the side surfaces 500a of the package body 500 may be formed into predetermined shapes using a lead forming tool (not shown) to allow the semiconductor package 1000 to have a shape suitable for mounting to an external unit or an underlying substrate. Although the outer portions 180 are depicted as being formed outwardly relative to the package body 500 in FIG. 13, those of ordinary skill in the art will recognize that the outer portions 180 can alternatively be formed downwardly and inwardly relative to the package body 500.

Figure 5:
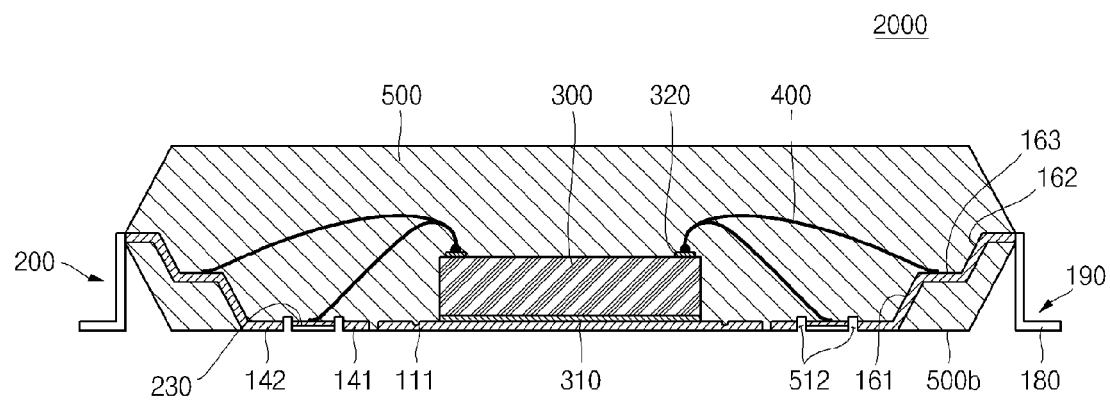
FIG. 5 is a cross-sectional view of a semiconductor package constructed in accordance with a second embodiment of the present invention.

Referring now to FIG. 5, there is shown in cross-section a semiconductor package 2000 constructed in accordance with a second embodiment of the present invention. The semiconductor package 2000 is substantially similar to the above-described semiconductor package 1000, with only the distinctions between the semiconductor packages 2000, 1000 being described below.

The sole distinction between the semiconductor packages 2000, 1000 lies in the bottom surfaces of the power bars 230 included in the semiconductor package 2000 being half-etched. As a result of such half-etching, the bottom surfaces of the power bars 230 are covered by the package body 500, unlike those of the power bars 130 of the semiconductor package 1000 which, as indicated above, are exposed in and substantially flush with the bottom surface 500b of the package body 500. Since the power bars 230 in the semiconductor package 2000 are not exposed to the outside, higher electrical reliability is achieved in the semiconductor package 2000. In such semiconductor package 2000, the power bars 230 can be utilized as power supply or ground terminals or to ensure a stable supply of power or ground voltage, without any change in the number of lands 143, 144. The method for fabricating the semiconductor package 2000 is substantially the same as that described above in relation to the semiconductor device 1000, steps S2 through S10 also being carried out to fabricate the semiconductor package 2000. In this regard, the only distinction lies in relation to step S1, wherein the leadframe 100 for the semiconductor package 2000 is further prepared by half-etching the power bars 230 in the aforementioned manner.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:
1. A semiconductor package, comprising:
a generally planar die pad defining multiple peripheral edge segments;
a plurality of power bars arranged to at least partially circumvent the die pad in spaced relation thereto;
a plurality of first leads disposed in spaced relation to the power bars and the die pad, the first leads being positioned inwardly of the power bars between the power bars and the die pad, with at least some of the first leads being electrically isolated from the die pad;
a plurality of second leads disposed in spaced relation to and positioned outwardly of the power bars, each of the second leads including first and second downsets formed therein in spaced relation to each other;
a plurality of third leads disposed in spaced relation to and positioned outwardly of the power bars, at least some of the third leads including a downset formed therein;
a semiconductor die attached to the die pad and electrically connected to at least one of each of the first, second and third leads, and to at least one of the power bars; and
a package body defining a generally planar bottom surface and multiple side surfaces, the package body at least partially encapsulating the first, second and third leads, the power bars, and the semiconductor die such that the first and second downsets of the second leads and the downsets of the third leads are covered by the package body, at least portions of the die pad, the first leads and the second leads are exposed in and substantially coplanar with the bottom surface of the package body, and portions of the third leads protrude from at least one of the side surfaces of the package body.

2. The semiconductor package of claim 1 wherein each of the third leads comprises:
- an inner portion which is covered by the package, the inner portions of at least some of the third leads including a downset formed therein; and
- an outer portion which protrudes from at least one of the side surfaces of the package body.

3. The semiconductor package of claim 1 wherein:
- the die pad has a generally quadrangular configuration;
- the first, second and third leads are segregated into at least four sets which each extend along and in spaced relation to a respective one of the peripheral edge segments of the die pad; and
- four power bars are arranged so as to extend along and in spaced relation to respective one of the peripheral edge segments of the die pad.

4. The semiconductor package of claim 1 wherein four power bars are arranged so as to extend along and in spaced relation to the peripheral edge segments of the die pad.

5. The semiconductor package of claim 1 wherein:
- at least two tie bars are connected to and protrude from the die pad;
- each of the power bars extends between and in spaced relation to an adjacent pair of the tie bars; and
- portions of the tie bars are exposed in the bottom surface of the package body.

6. The semiconductor package of claim 1 wherein portions of the power bars are exposed in the bottom surface of the package body.

7. The semiconductor package of claim 1 wherein each of the power bars is half etched and fully covered by the package body.

8. The semiconductor package of claim 1 wherein the semiconductor die is electrically connected to at least some of the first, second and third leads and at least one of the power bars by conductive wires which are covered by the package body.

9. The semiconductor package of claim 1 wherein:
- each of the second leads includes a first segment, a second segment defining a wire bond zone, and a third segment, the first segment being disposed between the first downset and the die pad and defining a land which is exposed in the bottom surface of the package body, the first downset extending between the first and second segments, and the second downset extending between the second and third segments;
- each of the third leads has inner and outer portions, the inner portion of each of the third leads including a first segment which defines a wire bond zone, and a second segment, the downset of each of the third leads extending between the first and second segments thereof; and
- the conductive wires extend from the semiconductor die to respective ones of the wire bond zones of the second and third leads.

10. The semiconductor package of claim 9 wherein:
- each of the first leads includes a top surface and a bottom surface defining a land which is exposed in the bottom surface of the package body; and
- the conductive wires extend from the semiconductor die to the top surfaces of respective ones of the first leads.

11. The semiconductor package of claim 10 wherein:
- the die pad, the first leads, the power bars, and the first segments of the second leads extend along a first plane;
- the wire bond zones of the second and third leads each extend along a second plane which is disposed in spaced, generally parallel relation to the first plane; and
- the third segments of the second leads, the second segments of the inner portions of the third leads, and the outer portions of the third leads each extend along a third plane which is disposed in spaced, generally parallel relation to the second plane such that the second plane extends between the first and third planes.

12. The semiconductor package of claim 10 wherein:
- the die pad has a generally quadrangular configuration;
- the first, second and third leads are segregated into at least four sets which each extend along and in spaced relation to a respective one of the peripheral edge segments of the die pad;
- four power bars are arranged so as to extend along and in spaced relation to respective one of the peripheral edge segments of the die pad; and
- the lands defined by the first leads of each set thereof are staggered relative to the lands defined by the second leads of a corresponding set thereof.

13. The semiconductor package of claim 12 wherein the inner portions of some of the third leads extend partially between an adjacent pair of second leads.

14. The semiconductor package of claim 1 wherein the bottom surface of the package body includes a plurality of grooves formed therein, some of the grooves extending between the power bars and the first leads, and some of the grooves extending between the power bars and the second leads.

15. A semiconductor package, comprising:
- a die pad;
- a power bar arranged in spaced relation with and generally parallel to a peripheral edge segment of the die pad;
- a plurality of first leads disposed in spaced relation to the power bar and the die pad, the first leads being positioned generally perpendicularly inward of the power bar between the power bar and the die pad, with at least some of the first leads being electrically isolated from the die pad;
- a plurality of second leads disposed in spaced relation to and positioned generally perpendicularly outward of the power bar;
- a plurality of third leads disposed in spaced relation to and positioned outwardly of the power bar;
- a semiconductor die attached to the die pad and electrically connected to at least one of each of the first, second and third leads, and to the power bar; and
- a package body defining a generally planar bottom surface and multiple side surfaces, the package body at least partially encapsulating the first, second and third leads, the power bar, and the semiconductor die such that at least portions of the die pad, the first leads and the second leads are exposed in and substantially coplanar with the bottom surface of the package body, and portions of the third leads protrude from at least one of the side surfaces of the package body.

16. The semiconductor package of claim 15 wherein:
- the die pad defines multiple peripheral edge segments; and
- a plurality of power bars are arranged to at least partially circumvent the die pad in spaced relation thereto.

17. The semiconductor package of claim 16 wherein:
- the die pad has a generally quadrangular configuration;
- the first, second and third leads are segregated into at least four sets which each extend along and in spaced relation to a respective one of the peripheral edge segments of the die pad; and
- the plurality of power bars are arranged so as to extend along and in spaced relation to respective one of the peripheral edge segments of the die pad.

18. The semiconductor package of claim 15 wherein a portion of the power bar is exposed in the bottom surface of the package body.

19. The semiconductor package of claim 15 wherein the power bar is half etched and fully covered by the package body.

\* \* \* \* \*